United States Patent
Lee et al.

(10) Patent No.: US 12,085,867 B2
(45) Date of Patent: Sep. 10, 2024

(54) LITHOGRAPHY PROCESS MONITORING METHOD

(71) Applicant: Taiwan Semiconductor Manufacturing Co., Ltd., Hsinchu (TW)

(72) Inventors: Chih-Jie Lee, Taipei (TW); Shih-Chun Huang, Hsinchu (TW); Shih-Ming Chang, Hsinchu (TW); Ken-Hsien Hsieh, Taipei (TW); Yung-Sung Yen, New Taipei (TW); Ru-Gun Liu, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/360,618

(22) Filed: Jul. 27, 2023

(65) Prior Publication Data

US 2023/0367234 A1    Nov. 16, 2023

Related U.S. Application Data

(63) Continuation of application No. 17/815,155, filed on Jul. 26, 2022, now Pat. No. 11,782,352, which is a continuation of application No. 17/301,215, filed on Mar. 29, 2021, now Pat. No. 11,467,509, which is a continuation of application No. 16/227,939, filed on Dec. 20, 2018, now Pat. No. 10,962,892.

(60) Provisional application No. 62/738,198, filed on Sep. 28, 2018.

(51) Int. Cl.
*G03F 9/00* (2006.01)
*G03F 7/20* (2006.01)

(52) U.S. Cl.
CPC .......... *G03F 9/7026* (2013.01); *G03F 7/2004* (2013.01); *G03F 7/2041* (2013.01)

(58) Field of Classification Search
CPC ..... G03F 9/7026; G03F 7/2004; G03F 7/2041
See application file for complete search history.

(56) References Cited

U.S. PATENT DOCUMENTS

| | | | |
|---|---|---|---|
| 8,716,841 B1 | 5/2014 | Chang et al. | |
| 8,736,084 B2 | 5/2014 | Cheng et al. | |
| 8,796,666 B1 | 8/2014 | Huang et al. | |
| 8,837,810 B2 | 9/2014 | Chen et al. | |
| 9,093,530 B2 | 7/2015 | Huang et al. | |
| 9,134,633 B2 | 9/2015 | Lin et al. | |
| 9,230,867 B2 | 1/2016 | Cheng et al. | |
| 9,304,403 B2 | 4/2016 | Lin et al. | |
| 9,404,743 B2 | 8/2016 | Chiu et al. | |
| 9,548,303 B2 | 1/2017 | Lee et al. | |
| 2004/0223137 A1 | 11/2004 | Littau et al. | |
| 2016/0363871 A1 | 12/2016 | Van Oosten et al. | |

FOREIGN PATENT DOCUMENTS

| | | |
|---|---|---|
| CN | 101169594 A | 4/2008 |
| CN | 103676497 A | 3/2014 |
| CN | 105319867 A | 2/2016 |
| CN | 107710073 A | 2/2018 |
| CN | 107949807 A | 4/2018 |
| CN | 108369389 A | 8/2018 |
| JP | 2009104024 A | 5/2009 |
| KR | 20180016589 A | 2/2018 |
| TW | 201102769 A | 1/2011 |
| TW | 1432915 B | 6/2013 |
| TW | 201324061 A | 6/2013 |
| WO | 2006012388 A2 | 2/2006 |

OTHER PUBLICATIONS

Takahashi, Sato, et al., "Focus Monitor Using Asymmetric Diffraction Rays by Off-Axis Monopole Illumination", Japan Journal of Applied Physics, vol. 48, No. 6S, (2009), 4pages.
Tawarayama, Kazuo, et al., "Focus monitor application to EUV exposure tool using asymmetric diffraction rays by off-axis monopole illumination", Semiconductor Leading Edge Technologies, Inc. (Selete), EUVL Symposium, (2010), 18 pages. http://euvlsymposium.lbl.gov/pdf/2010/pres/ET-P02.pdf.

*Primary Examiner* — Christopher G Young
(74) *Attorney, Agent, or Firm* — Haynes and Boone, LLP

(57) ABSTRACT

A method of performing a lithography process includes providing a test pattern. The test pattern includes a first set of lines arranged at a first pitch, a second set of lines arranged at the first pitch, and further includes at least one reference line between the first set of lines and the second set of lines. The test pattern is exposed with a radiation source providing an asymmetric, monopole illumination profile to form a test pattern structure on a substrate. The test pattern structure is then measured and a measured distance correlated to an offset of a lithography parameter. A lithography process is adjusted based on the offset of the lithography parameter.

20 Claims, 15 Drawing Sheets

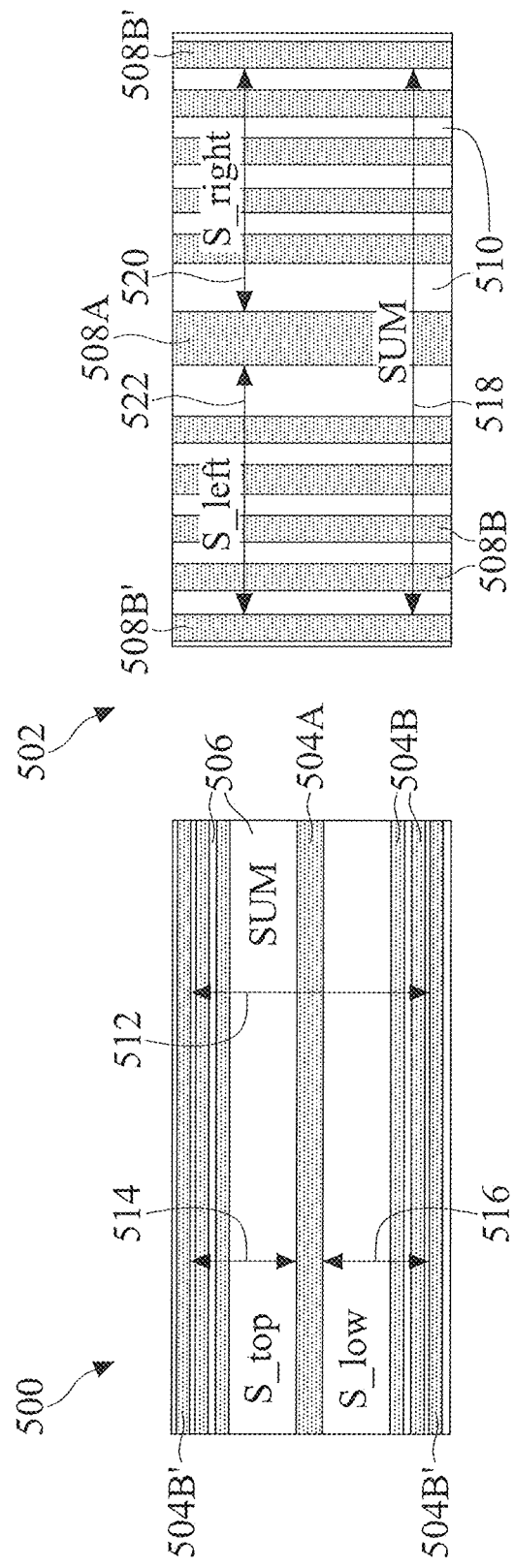

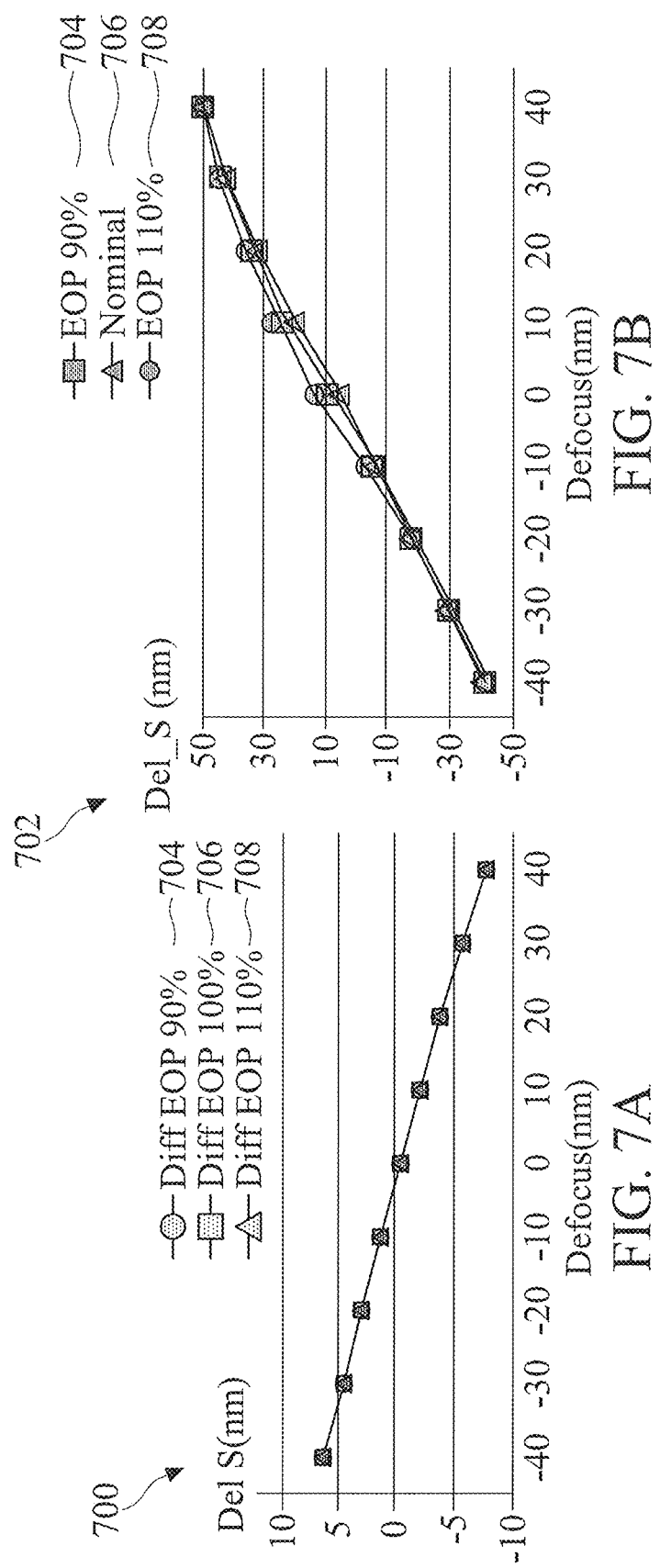

LITHOGRAPHY PROCESS MONITORING METHOD

CROSS-REFERENCE TO RELATED APPLICATION

This application is a continuation of U.S. patent application Ser. No. 17/815,155, filed Jul. 26, 2022, which is a continuation of U.S. patent application Ser. No. 17/301,215, filed Mar. 29, 2021, now U.S. Pat. No. 11,467,509, which is a continuation of U.S. application Ser. No. 16/227,939, filed Dec. 20, 2018, now U.S. Pat. No. 10,962,892, which claims the benefit of U.S. Provisional Application No. 62/738,198, filed Sep. 28, 2018, entitled "LITHOGRAPHY PROCESS MONITORING METHOD," hereby incorporated by reference in their entireties.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

For example, some advances compensate for optical effects and processing imperfections that occur near the limits of lithography. In many examples, ICs features are defined and formed on a semiconductor substrate using a set of photolithographic masks. The masks have patterns formed by transmissive and/or reflective regions. During a photolithographic exposure, radiation such as ultraviolet light passes through or reflects off the mask before striking a photoresist coating on the substrate. The mask transfers by exposure the pattern onto the photoresist, which is then selectively removed to reveal the pattern. The substrate then undergoes processing steps that take advantage of the shape of the remaining photoresist to create circuit features on the substrate. When the processing steps are complete, another photoresist is applied and substrate is exposed using the next mask. In this way, the features are layered to produce the final circuit.

When an exposure apparatus illuminates a mask with radiation, it is necessary to provide suitable parameters for the radiation—such as the focal position. Assuring these parameters such as focal position can be a costly and timely expenditure. Thus, improvement in accurate monitoring of lithography process parameters is desired.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A and 5B are exemplary test patterns according to various embodiments of the present disclosure.

FIGS. 6A, 6B, 7A, and 7B are example graphs (or plots) of measurements of a test pattern and corresponding lithography process parameters according to various embodiments of the present disclosure.

DETAILED DESCRIPTION

Figure 1:
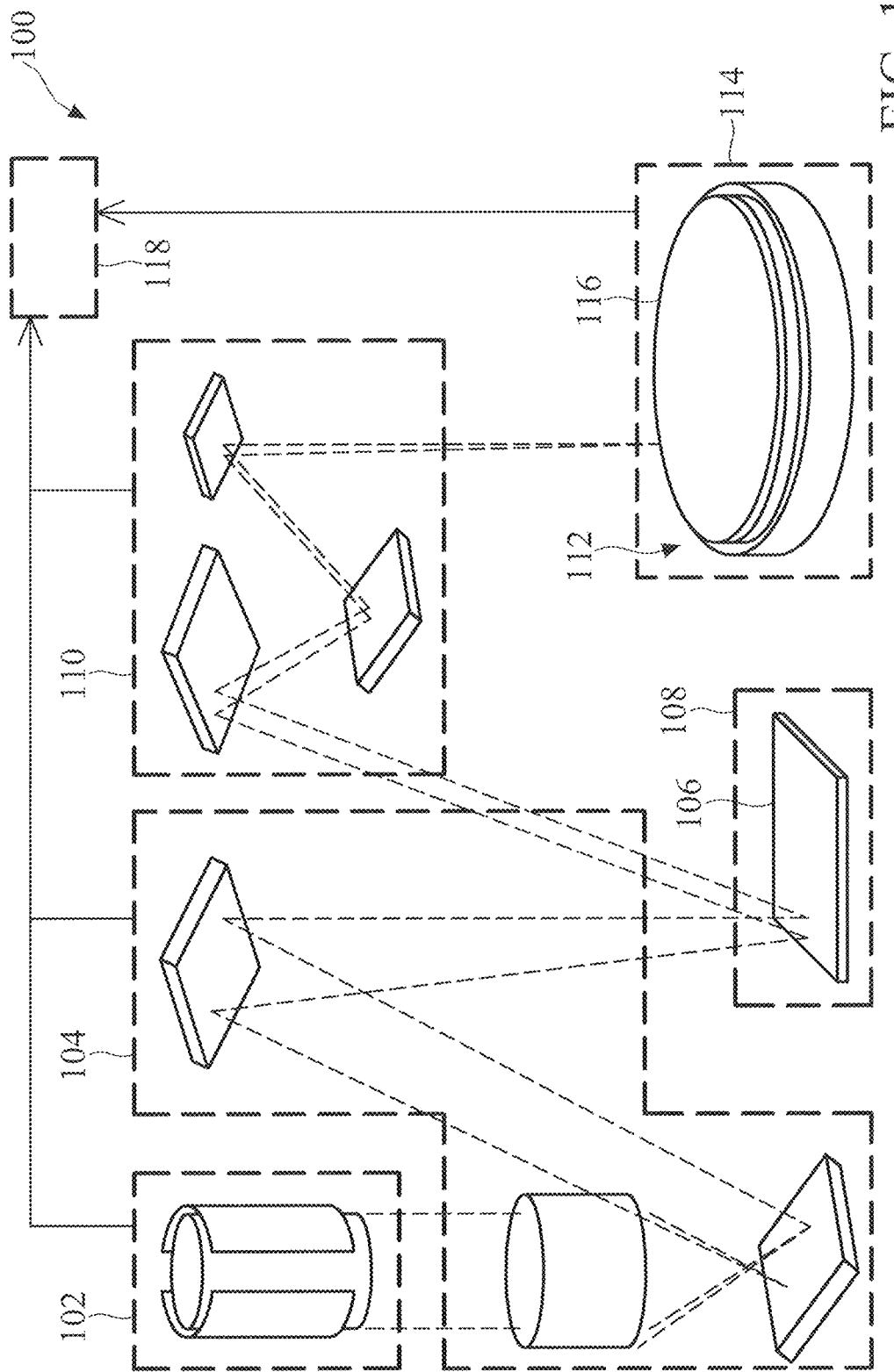
FIG. 1 is a block diagram of a lithography system according to various embodiments of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations beyond the extent noted.

Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," "right," "left," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

The advanced lithography process, method, systems, and materials described herein can be used in many applications, including fin-type field effect transistors (FinFETs). For example, the fins may be patterned to produce relatively close spacing between features, for which the disclosure herein is well suited (e.g., for controlling and/or monitoring such processes). In addition, spacers used in forming fins of FinFETs, also referred to as mandrels, can be processed using lithography systems and methods discussed herein.

As feature sizes shrink, differences between mask features and the features formed on (exposed onto) a substrate impart a larger effect on device performance. In an example of a simple line, a variety of effects may tend to round the line ends rather than produce a crisp corner and may tend to produce a line of irregular width. These effects may come from, for example, the illumination source, the mask, the lithography system, the fabrication process (e.g., developing, etching, depositing, etc.), and/or other sources. The impact of these variations may be exacerbated as the size of a feature shrinks because the variations remain the same or become larger, and thus the imperfection grows relative to the feature.

To compensate for this, many examples of the present disclosure develop a layout of a test pattern to be formed on a mask and, in turn, the test pattern is exposed on a substrate to form a test pattern structure. The test pattern structure on the substrate is analyzed to determine measurements (e.g., shifting of aspects of the pattern) that can be correlated to lithography parameter that may be off target. The analysis may include measurement to various dimensions of the test pattern structure that are indicative of a pattern shift that is correlated to or indicative of a lithography parameter offset. Examples of the lithography parameters determined are focus parameters (e.g., best focus) and dose parameters. The best focus and/or dose can be modified for future exposures using the analysis of the test structure. In some embodiments, the best focus and/or dose are confirmed by use of the test pattern structure. In some such examples, this allows for a monitoring scheme to be used during production of integrated circuits (ICs). For example, an exposure process may form the test pattern structure on a sample of substrates where circuit patterns are being also formed.

As discussed below, in order to provide a measurement of the test pattern structure that is indicative of the lithography parameter offset, the test pattern must be careful designed as well as the measurements to be taken of said pattern carefully selected. In some embodiments below, the test pattern is designed with respect to use with an asymmetric source of radiation for exposure of the test pattern, even though such an illumination profile is not used to expose the main pattern for the IC devices, i.e., circuit pattern. Rather, an illumination profile providing a symmetric irradiation may be used to expose circuit pattern on the substrate(s). Thus, in some embodiments, the illumination profile of a given source is simply changed for the exposure of the test pattern, and then returned to its baseline illumination profile after exposure of the test pattern without a movement of the target substrate required.

As also described below, the present disclosure provides a technique for monitoring a lithography exposure process. An example of a system for exposing a target substrate that may be monitored by the methods is described with reference to FIG. 1. In that regard, FIG. 1 is a block diagram of a lithography system 100 according to various embodiments of the present disclosure. The lithography system 100, which may also be referred to as a scanner, is operable to perform a lithographic exposure process utilizing a characteristic radiation source and exposure mode. In the illustrated embodiments, the lithography system 100 is an extreme ultraviolet (EUV) lithography system designed to expose a target substrate using EUV radiation having a wavelength ranging between about 1 nm and about 100 nm. In some exemplary embodiments, the lithography system 100 includes a radiation source 102 that generates EUV radiation with a wavelength centered at about 13.5 nm. In one such embodiment, a EUV radiation source 102 utilizes laser-produced plasma (LPP) to generate the EUV radiation by heating a medium such as droplets of tin into a high-temperature plasma using a laser.

The lithography system 100 may also include an illuminator 104 that focuses and shapes the radiation produced by the radiation source 102. The illuminator 104 may include refractive optical components, including monolithic lenses and/or array lenses (e.g., zone plates), and may include reflective optical components, including monolithic mirrors and/or mirror arrays. The number of optical components shown FIG. 1 have been reduced for clarity, and in actual embodiments, the illuminator 104 includes dozens or even hundreds of lenses and/or mirrors. The optical components are arranged and aligned to project radiation emitted by the radiation source 102 onto a mask 106 retained in a mask stage 108. The optical components of the illuminator 104 may also shape the radiation along the light path in order to produce a particular illumination pattern upon the mask 106.

After being absorbed by or reflecting off the mask 106, the radiation is directed through a projection optics module 110, also referred to as a Projection Optics Box (POB). Similar to the illuminator 104, the projection optics module 110 may include refractive optical components, including monolithic lenses and/or array lenses (e.g., zone plates), and may include reflective optical components, including monolithic mirrors and/or mirror arrays. The optical components of the projection optics module 110 are arranged and aligned to direct radiation reflecting off the mask 106 and to project it onto a target substrate 112, such as a semiconductor substrate (e.g., semiconductor wafer) or any other suitable substrate, retained in a substrate stage 114. In addition to guiding the radiation, the optical components of the projection optics module 110 may also enlarge, narrow, focus, and/or otherwise shape the radiation along the radiation path.

Radiation projected by the projection optics module 110 on the substrate 112 exposes the substrate 112 by causing changes in a photosensitive material disposed on the target substrate. In an example, the substrate 112 includes a semiconductor substrate with a photoresist 116. Portions of the photoresist 116 that are exposed to the radiation undergo a chemical transition making them either more or less sensitive to a developing process. In an exemplary embodiment, after the exposure, the photoresist 116 undergoes a post-exposure baking, developing, rinsing, and drying in order to complete the transition. Subsequent processing steps performed on the substrate 112 may use the pattern of the remaining photoresist 116 to selectively process portions of the substrate 112.

As noted above, a number of effects may cause the pattern formed in the photoresist 116 to differ from the intended pattern. Differences in the pattern may be caused by aspects of the system 100. For example, the illumination provided by the system 100 may vary across a substrate 112 or between processing of multiple substrates similar to substrate 112. In other words, even assuming defect-free optics and masks, the complexities of the beam paths and other optical effects within the system 100 may cause the dose (i.e., the exposure intensity) to vary across the surface of a given substrate 112 and may cause the dose to vary from substrate to substrate. Similarly, the focus of the projected features may vary across a substrate 112 and between substrate due to the beam path, the quality of the optics, variations in the substrate 112, irregularities the photoresist 116 surface, environmental factors such as vibration, and/or other factors. Accordingly, in the example below, process conditions such as dose variations, focus variations, that impact the features formed in the photoresist 116 are monitored and modified (if needed) during the systems use for exposure of a given substrate 112 or modified for use for processing of a subsequent target substrate.

It is noted that a control system 118 is illustrated in the system 100. The control system 118 may include a control unit that may receive or store an exposure parameter such as focus value or dose value. Moreover, the control system 118 controls each part of the exposure apparatus of the system 100 including the source 102, the stage 114, the illuminator 104, projection optics module 110, mask stage 108, and/or other components of the system 100. The control system 118 may be located within the system 100 or be coupled thereto. Further discussion of a control system 902, similar to control system 118, is provided below at FIG. 9.

The mask 106 includes various layers defining a pattern formed on a mask substrate. The mask 106 has a substrate that may include a Low Thermal Expansion Material (LTEM) such as quartz, LTEM glass, silicon, silicon carbide, silicon oxide, titanium oxide, Black Diamond® (a trademark of Applied Materials), and/or other suitable mask substrate. The mask 106 may include a reflective structure, such as a MultiLayer Mirror (MLM), disposed on the mask substrate. An MLM may include a number of alternating material layers tailored in thickness and/or material to achieve optimal constructive interference of the radiation reflected at each material interface while reducing light absorption. In an exemplary embodiment, an MLM includes 40 pairs of alternating molybdenum and silicon (Mo—Si) layers. In further exemplary embodiments, an MLM includes between 20 and 80 pairs of alternating molybdenum and beryllium (Mo—Be) layers. Radiation that reaches the reflective structure of the mask is reflected back for use in exposing the photoresist 116 of the target substrate 112. Various other layers may be present such as, capping layer(s) and absorptive layer(s) providing the patterning.

Figure 2:
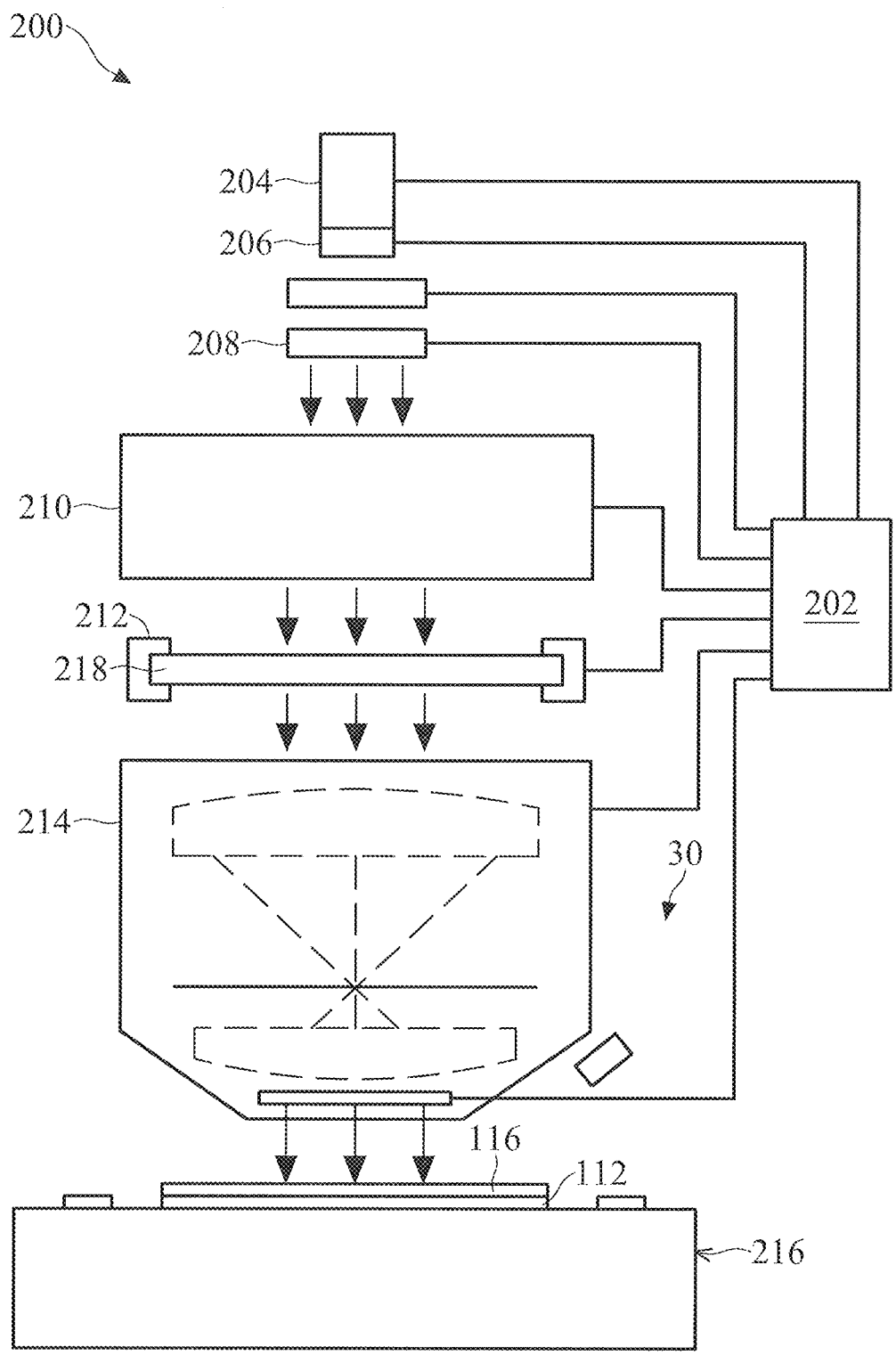
FIG. 2 is a block diagram of another lithography system according to various embodiments of the present disclosure.

While a EUV system is described above, in other embodiments, the lithography system operable to provide an exposure of a substrate suitable for use with the present methods and systems may include a source of various other wavelengths including transmission type optical systems; FIG. 2 is exemplary of a highly simplified block diagram of a transmission type optical system.

Similar to the system 100, the exposure system 200 includes a control device 202 that may be substantially similar to the control system 118 above. The exposure system 200 includes a radiation source 204, an aperture 206, filters 208, illumination optical systems 210, mask stage 212, projection optical system 214, and a substrate stage 216. The substrate stage 216 may position a substrate 112, substantially similar to as discussed above. It is noted that the type of photoresist 116 may be selected to be suitable for the radiation source used.

The radiation source 204 in some embodiments may be a deep ultraviolet (DUV) radiation source. The DUV light source may include exciting a molecule of a noble gas, such as argon (Ar), krypton (Kr), or xenon (Xe), to react with a molecule of a halogen, such as fluorine (F) and chlorine (Cl). Example DUV radiation sources 204 include KrF excimer laser (for example a wavelength approximately 248 nm) or ArF excimer laser (for example a wavelength approximately 193 nm). A mask 218 disposed on the mask stage 212 may be a transmissive mask. The transmissive mask, like a reflective mask discussed above, may further implement resolution enhancement techniques such as phase-shifting, off-axis illumination (OAI), optical proximity correction (OPC), and/or other suitable features. In some embodiments, the lithography system is an immersion lithography system.

The radiation sources 102 and/or 204 in conjunction with the accompanying components of the lithography system may be operable to provide different illumination modes or profiles incident a mask 106, 218 during the exposure process. For example, during exposure of a target substrate, the radiation sources 102 and/or 204 in conjunction with the accompanying components may be modified to provide a first illumination mode and a second, different illumination mode. The illumination modes may different in the portions of the field of exposure (e.g., pupil) that are "on" versus "off". In some embodiments, at least one illumination mode is an off-axis, asymmetrical (e.g., monopole) illumination. In some embodiments, another illumination mode is a symmetrical, multi-pole (e.g., dipole, quadrupole) illumination, which may be off-axis or on-axis illumination. In some embodiments, another illumination mode is a symmetrical illumination including a monopole, annular or other shaped illumination, which may be off-axis or on-axis illumination.

In an embodiment, for an EUV method and/or system, the asymmetrical illumination may be provided by tuning the source, for example, through the use of software. For a DUV method and/or system, the source may provide asymmetrical illumination by tuning the source, for example, by providing an off-set to a calibration system that moves a monopole to an offset location (e.g., from a center location); by physically blocking a portion of the irradiation, for example, blocking one pole of a dipole illumination; or by modifying the output of the scanner itself.

Figure 8B:
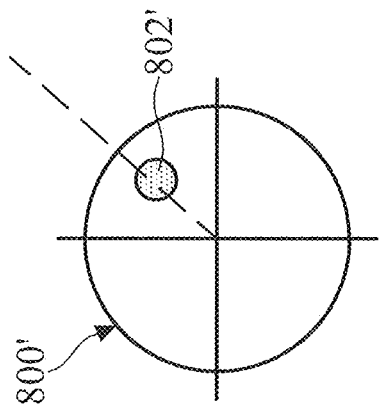
FIGS. 8A, 8B, 8C, and 8D are example illumination mode profiles according to various embodiments of the present disclosure.
Figure 8D:
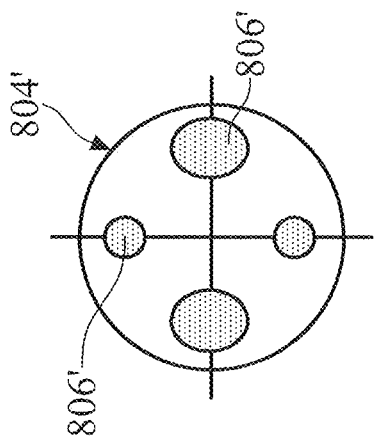
Figure 8A:
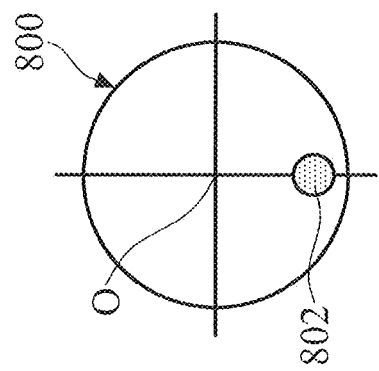
Figure 8C:
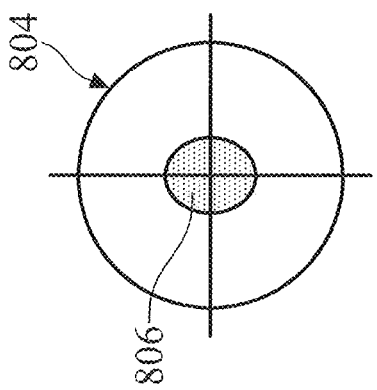

FIGS. 8A and 8B illustrate asymmetrical, monopole illumination modes or profiles. The illumination profile may be defined by the size of the pole (e.g., diameter, shape and dimension) of an "on" portion of the pupil, the radial location of the pole, the angle of the pole from a given origin point, the number of poles, and/or other configurations of the "on" portion of the pupil. The FIGS. 8A and 8B are exemplary only and non-limiting. The larger circle represents the full pupil, while the smaller circle represents the pole (or "on" portion transmitting radiation), while the remainder of the available pupil is in an "off" state. Referring to the example of FIGS. 8A and 8B, illustrated are pupils 800, 800' having a respective, single pole 802, 802' disposed asymmetrically within the pupil 800, 800'. The poles 802, 802' are asymmetrical in that they are not symmetrical about the center of the pupil 800, 800'. The pole 802, 802' represents the "on" state delivering radiation, while the other portions of the pupil 800 are in an "off" state. It is noted that the circular shape of the pole 802, 802' is for ease of reference only. The pole may similarly be other shapes including those defined by an inner and outer sigma and open angle. The illumination profile may be provided by a controllable illumination mode selection device including elements such as, switchable mirrors, filters, zoneplates, magnetic elements, reflective elements, lens, or other means to direct, shape and control radiation. FIGS. 8C and 8D illustrate for reference other illumination modes or profiles 804 and 804' where the illumination profile provides a symmetrical irradiation. The poles 806 and 806' respectively are oriented symmetrically within the pupil and about the center point or axis of the pupil 800, 800'. As above, the circular shape of the poles 806, 806' is for reference only. The illumination modes of FIGS. 8C and 8D may be used for exposure of the circuit pattern such as discussed with reference to block 320 of the method 300.

When forming a circuit pattern onto a substrate using an exposure process, the lithography systems, such as the system 100 and system 200 described above, include focus control components to minimize out-of-focus states that can occur if the substrate is not at a suitable focus position. The lithography system is ideally controlled such that the "best focus" position is provided (e.g., by movement of the substrate stage or other component) in the vertical (height) direction. However, as the feature size of the circuit pattern decreases, the depth of focus (DOF) also decreases giving a smaller range of focus offset that the process can tolerate with acceptable performance. Thus with decreasing circuit pattern sizes, it is increasingly important to control the focus position and therefore, accurate focal measurement methods and systems are desired. However, sources of focus offset include environmental vibration and intra-control precision (e.g., drift over processed lot to processed lot) of the system. The latter source of focus offset is desirably monitored on a smaller and smaller scale. In that regard, certain embodiments of the methods and systems discussed herein are affective in monitoring focus including to a less than 10 nanometer (nm) scale.

Figure 3:
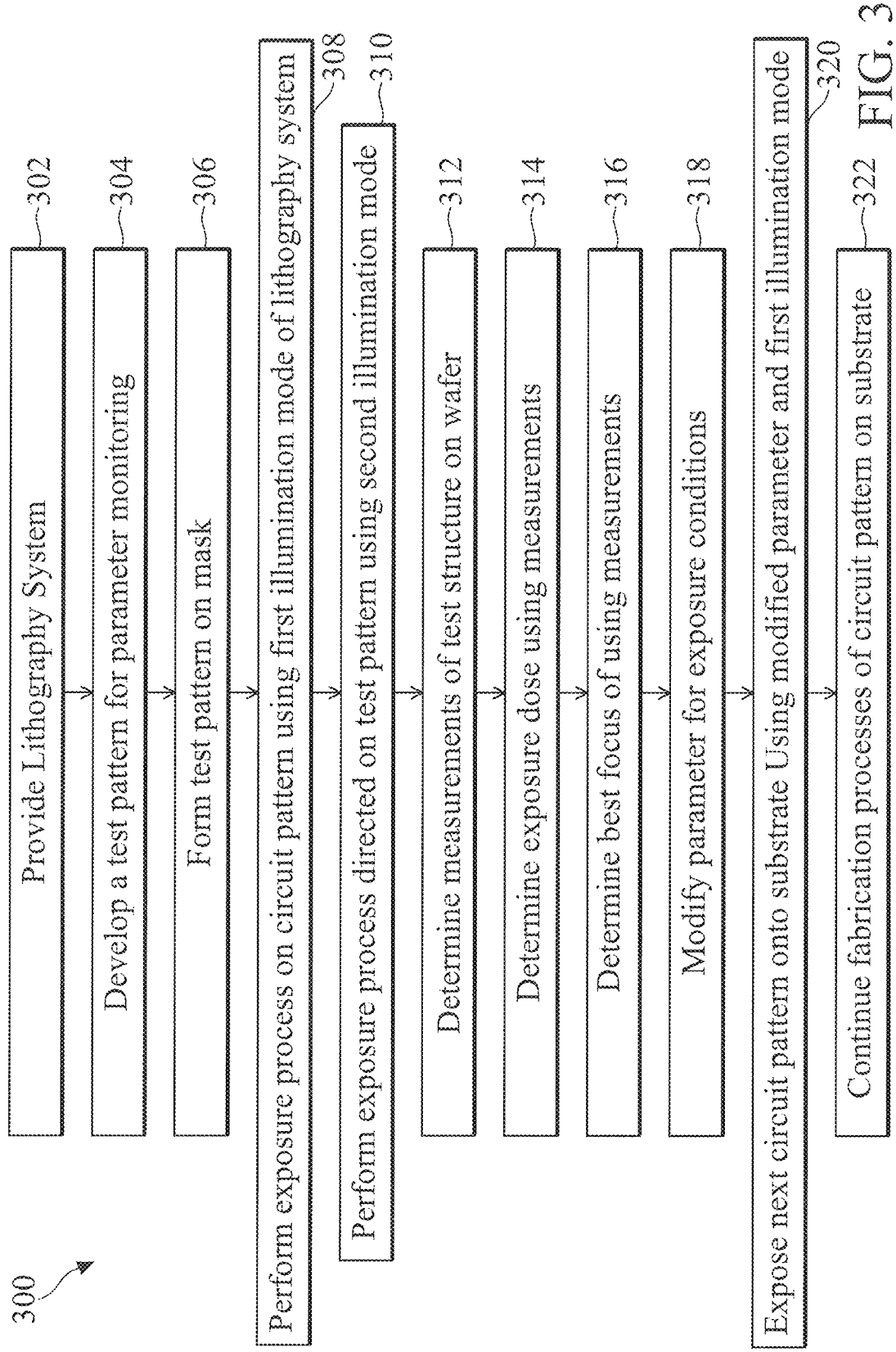
FIG. 3 is a flow diagram of a method of monitoring a parameter of a lithography system according to various embodiments of the present disclosure.

Referring now to FIG. 3, illustrated is a method 300 of monitoring parameters of a lithography tool such as an exposure tool (or scanner). One parameter that may be monitored may be focus position on a surface of a target substrate (e.g., best focus) according to various embodiments of the present disclosure. Another parameter may be the exposure dose.

The method 300 begins at block 302 where a lithography system is provided. The lithography system provided may be one implementing reflective or transmissive lithography type optical exposure methods. Example of lithography systems include system 100 and system 200 discussed above with reference to FIGS. 1 and 2, respectfully. It is noted that additional steps can be provided before, during, and after the method 300, and some of the steps described can be replaced or eliminated for other embodiments of the method 300. In some embodiments, the block 302 of the method 300 includes processing using the lithography tool one or more substrates such as to form a circuit pattern onto the substrates. This exposure may be performed using an illumination mode or profile that is symmetric in its irradiation profile of a photomask.

The method 300 proceeds to block 304 where a test pattern is developed for the monitoring steps discussed below. The test pattern may include a plurality of lines and spaces oriented in an X-direction or Y-direction (the vertical direction of the focal plane being referred to as the Z-direction.) The test pattern is provided such that it is suitable for determining a pattern shift due to drifting from nominal defocus or dose of the illumination system as detailed below. The nominal defocus may be the defocus amount inherent with the illumination system and/or characterized at a beginning point of illumination system. In other words, a baseline. It may include the defocus understood to exist in the illumination system prior to the processing of wafers (e.g., determined as part of a preventive maintenance or tool qualification check).

In an embodiment, the test pattern is designed for use of an off-axis illumination by a system providing a radiation beam having an illumination profile of an off-axis, asymmetrical monopole illumination. The asymmetrical monopole illumination profile provides a configuration of a pupil where a single pole (e.g., monopole) is off-set from the center of the pupil (e.g., full available illumination field) as discussed above. The asymmetrical illumination may be offset to any direction of the center of the radiation field (e.g., right, left, upwards, downwards). As also discussed above, the illumination profile including the asymmetrical, monopole illumination may be provided by a controllable illumination mode selection device including elements such as, switchable mirrors, filters, zoneplates, magnetic elements, reflective elements, or other means to direct, shape and control radiation. It is noted that in some embodiments, the asymmetrical illumination may not be a single monopole but other illumination profile (e.g., multi-pole) but with asymmetrical properties about the center point of the pupil.

In an embodiment, the test pattern is designed for use of an off-axis, asymmetrical, monopole illumination by providing the line/spaces at a first pitch in some portion(s) of the test pattern and line/spaces at a second pitch in other portion(s) of the test pattern. The pitch may be measured as a width of the line plus a width of the adjacent space. The portion of the test pattern having the first pitch when irradiated with the illumination profile gives an asymmetric diffraction of light. That is that the radiation from the mask to be delivered toward the target substrate is of multiple orders ($1^{st}$ order, $0^{th}$ order, $2^{nd}$ order) which are not symmetrical in state and do not coincide. Thus, due to differences in reflection angles of the reflected radiation off of the mask (in the case of EUV) and in particular off of the pattern having the first pitch, certain position of the pattern will result in more reflected light. That is, certain diffraction orders are shadowed and certain diffraction orders are reflected towards the target substrate, resulting in an asymmetry of the diffraction pattern. In asymmetric diffraction, there is an optical path difference between diffraction orders of the diffracted radiation that is dependent upon the amount of defocus, which leads to the pattern to shifting when it is formed (exposed) as a structure on the target substrate. The test pattern portion providing a pattern that achieves asymmetric diffraction may be referred to herein as the offset testing pattern (e.g., wide pitch).

Figure 12:
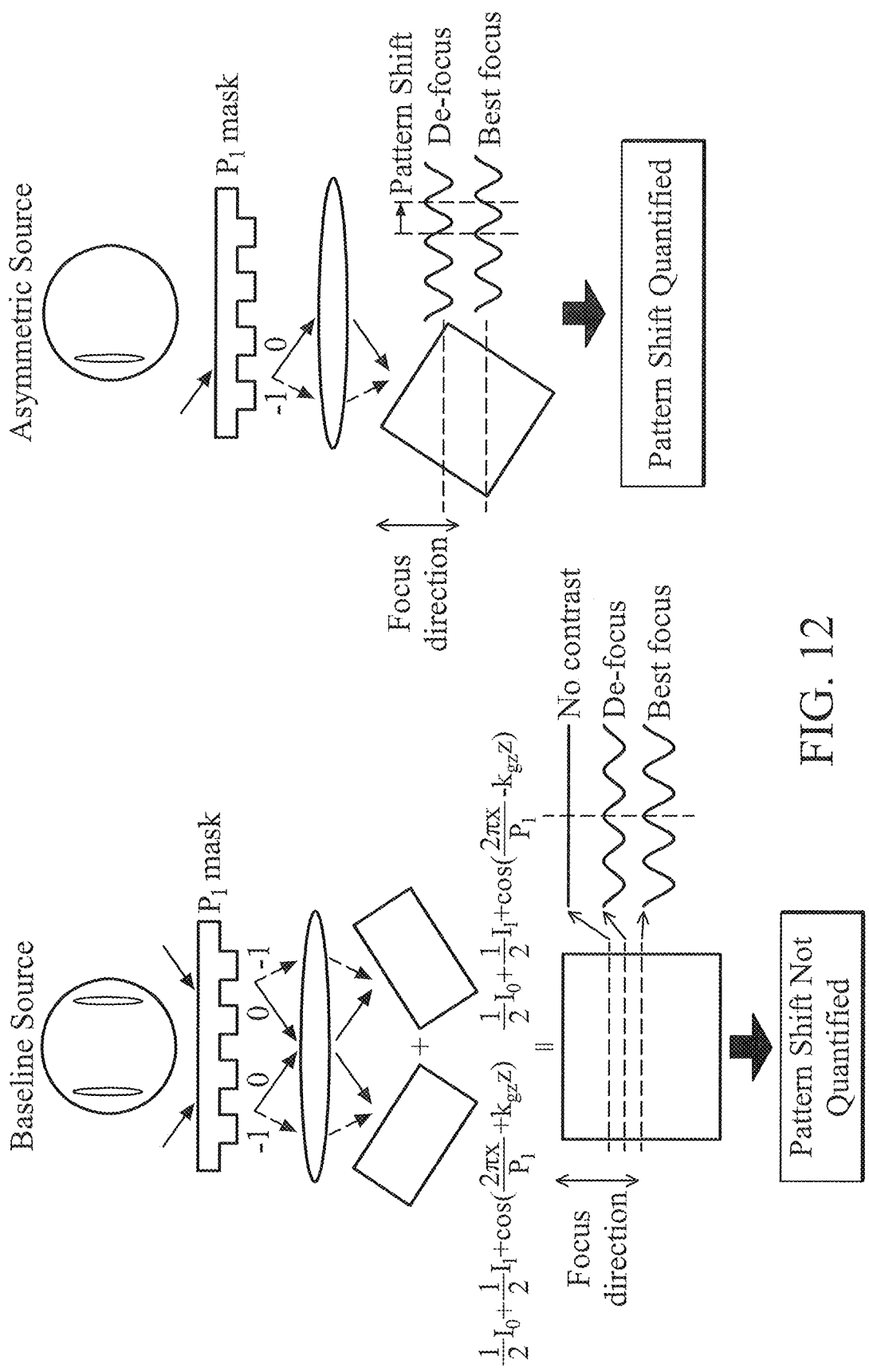

As introduced above, the test pattern may be further designed to include (in addition to the offset testing pattern) line/spaces at a second pitch (different than that of the offset testing pattern) in other portions of the test pattern. This portion of the testing pattern, when the pattern has the second pitch, when irradiated with the same illumination profile provides a symmetric diffraction. The portion of the test pattern providing the symmetric diffraction may be referred to as the reference pattern (e.g., dense pitch). The symmetric diffraction provides optical paths between diffraction orders to be the same and thus, provides convergence. Thus, regardless of the defocus, the reference pattern will be reproduced without pattern shift. The detailed description of the asymmetric/symmetric diffraction is shown in FIG. 12. Combining the reference pattern and the offset testing pattern into a single test pattern provides allows for measurements of the combination of patterns to determine the amount of pattern offset, and correlate that to a lithography parameter. That is, the asymmetric diffraction provided by the offset testing pattern exhibits a pattern shift in comparison to the reference pattern, and that pattern shift can be associated with or correlated to parameters of the lithography tool. Measurements of the test structure pattern as imaged, including the reference pattern and the offset testing pattern are taken to determine parameters of the lithography tool associated with various illumination profiles.

Thus, in block 304 there is provided a test pattern that includes the first pitch as an offset test pattern and features at second pitch as a reference pattern that allows for quantification of the shift of the pattern which corresponds, or can be correlated to a parameter of the lithography exposure (e.g., defocus amount and/or dose) as discussed below. Design of the test pattern is described in further detail with respect to the method of FIG. 4 below.

In some embodiments, the test pattern may include a plurality of line features and a space pattern repeatedly arranged in an X-direction. In some embodiments, the test pattern may include a plurality of line features and a space pattern repeatedly arranged in a Y-direction. The test pattern may include alternating Line/Space configuration, a Slots configuration, an alternating Contact/Holes configuration. The pattern type can be based on the device layer that is to be patterned. For example, in an embodiment, the device pattern is for Contact/Hole device layers, and thus, the test pattern is also be designed as Contact/Hole.

Referring to FIGS. 5A and 5B, illustrated are test patterns 500 and 502 respectively. In an embodiment, the test patterns 500 and 502 as illustrated are test pattern structures, having been formed on a semiconductor substrate. In other embodiments, the test patterns 500 and 502 as illustrated are test patterns as defined on a photomask (or simply mask). The test patterns 500 and 502 may be formed on a mask such as described with respect to the systems 100 and/or 200, discussed above. In an embodiment, the test pattern 500 is used for monitoring and/or controlling a EUV system, such as the system 100 described above with reference to FIG. 1. In an embodiment, the test pattern 502 is used for monitoring and/or controlling a DUV system, such as the system 200 described above with reference to FIG. 2. In an embodiment, the test pattern 502 is used for monitoring and/or controlling an immersion lithography system.

The test pattern 500 includes a plurality of line features 504 and a plurality of space features 506 interposing the line features 504. The line features 504A are provided at a first pitch and a first width. The line features 504B are provided at a second pitch and a second width. The line features 504A have a greater width and pitch than the line features 504B. The greater width and pitch features, such as 504A, may be referred to as wide space and wide CD. The smaller width and pitch features, such as 504B, may be referred to as dense pitch and dense CD. It is noted that a single line feature 504A is illustrated, however this is not limiting.

In an embodiment, there may be a buffer pattern between the line features 504A and 504B. The buffer pattern (e.g., feature) may provide for a thicker feature in order to improve the patternability of the set of patterns mitigating photoresist development (e.g., photoresist collapse) issues.

The test pattern 502 includes a plurality of line features 508 and a plurality of space features 510 interposing the line features 508. The line features 508A are provided at a first pitch and a first width. The line features 508B are provided at a second pitch and a second width. The line features 508A have a greater width and pitch than the line features 508B.

The line features 504B/508B may be selected as to provide for a width and pitch that provides for a reference pattern. In other words, the line features 504B/508B are provided such that with the illumination profile provided in block 310, symmetric diffraction occurs and even with defocus the pattern will not substantially shift. Thus, the portion of the testing pattern 500 having lines 504B provides portions providing reference patterns. Similarly, the portion of the testing pattern 502 having lines 508B provides portions providing reference patterns.

The line features 504A/508A may be selected to provide for a width and pitch that provides for an offset testing pattern. In other words, the line features 504A/508A are provided such that with the illumination profile provided in block 310, asymmetric diffraction occurs and the pattern will shift in a manner that can be correlated to the defocus amount as discussed below. Thus, the portion of the testing pattern 500 having lines 504A provides portions providing offset testing patterns. Similarly, the portion of the testing pattern 502 having lines 508A provides portions providing offset testing patterns.

The method 300 then proceeds to block 306 where the test pattern is formed on a mask. In an embodiment, the test pattern 500 is formed on a reflective mask such as the mask 106, discussed above with reference to FIG. 1. In an embodiment, the test pattern 502 is formed on a transmissive mask such as the mask 218, discussed above with reference to FIG. 2.

In an embodiment, the test pattern 500 is formed on a reflective mask suitable for EUV lithography. In an embodiment, the test pattern 502 is formed on a transmissive mask suitable for DUV lithography. However, the principles the present disclosure also apply to other mask types.

The method 300 then proceeds to block 308 where one or more target substrates (e.g., wafers) are exposed using the provided lithography system. In some embodiments, circuit patterns are exposed onto the target substrates. The circuit patterns may be exposed using radiation having an illumination profile that is different than that to be used for exposing the test pattern. In an embodiment, the illumination profile for exposing the circuit pattern(s) are symmetrical illumination, which is described above. For example, the illumination profile may be a full pupil, a multi-pole (e.g., dipole, quadrapole) configuration, a monopole, an annular ring or other shaped illumination provided the "on" portions of the pupil are symmetric. The illumination profile may be be provided off-axis or on-axis. In some embodiments, block 308 is omitted.

The method 300 then proceeds to block 310 where an exposure directed to the test pattern is performed. The exposure of the test pattern onto the target substrate may use the same source as above, but provide a different illumination mode or profile. For example, in some embodiments, the exposure of block 308 is performed using a first illumination mode and the block 310 is performed using a second illumination mode, different than the first. In an embodiment, the second illumination mode is an off-axis, asymmetrical illumination. In other words, the illumination profile for the illumination of block 310 is from a direction inclined with respect to the optical axis and asymmetrical to the optical axis. For example, the illumination profile may be a monopole or other illumination provided the "on" portions of the pupil are asymmetric with respect to the field of the pupil. Thus, between block 308 and block 310 of the method 300, the illumination shape provided to the mask is adjusted. For example, to provide asymmetric off-axis, monopole illumination in block 310.

In some embodiments, the test pattern structure is formed on the same substrate as the circuit pattern as discussed above in block 308. For example, in some embodiments, the test pattern may be formed onto a kerf region or in a dummy area of the substrate. In some embodiments, the test pattern structure has an overall area of approximately 1 micron (µm) squared. Thus, in some embodiments, despite the illumination profile being changed between block 308 and 310, the substrate (including the circuit pattern and the test pattern) is not moved but maintained on the stage such as stage 112 of FIG. 1 or stage 216 of FIG. 2. It is noted that the test pattern exposed in block 310 includes both the reference pattern and the offset test pattern. In other words, the reference pattern and the offset test pattern are exposed in a simultaneously in a single exposure process.

The method 300 then proceeds to block 312 where a plurality of measurements of the formed test pattern structure is performed on the substrate (e.g., wafer) having the test pattern structure exposed thereon. The measurements may be performed by scanning electron microscope (SEM). It is noted that in some embodiments the SEM is performed after not only the exposure of the test pattern, but the development of said pattern as well.

Using the example of the test pattern 500, the test pattern 500 structure having been formed on a target substrate is measured to determine various aspects of pattern shifting. In an embodiment, a line (or polygon) feature 504B' is identified for the measurement. The specific line feature 504B' may be identified by experimental and/or simulation data as providing a suitable sensitivity of its correlation with exposure parameters (e.g., defocus). That is, the line feature 504B' may be determined such that the resulting plots of the measurement of dimensions based on the position of line feature 504B' versus a lithography parameter is essentially flat as discussed in further detail below including with respect to FIGS. 11A, 11B, and/or 11C. In an embodiment, the line feature 504B' is identified as the $n^{th}$ line feature from the offset testing pattern features 504A, where n is an integer greater than 1. In a further embodiment, n equals 3. In another embodiment, n equals 5. In some embodiments, n is a number between 2 and 6. The identification of line feature 504B' (and thus, the identification of "n") is described below. In sum, the selection of the 'n' value is the number of features into the array where the proximity effect is gone. Thus, 'n' may be a larger value and still be within the scope of this disclosure. In an embodiment, a measurement 512 (referred to as SUM) is performed between line features 504B' (e.g., upper and lower). In an embodiment, a measurement 514 (referred to as Space_top or simply S_top) between 504B' line feature and an edge of the nearest line feature 504A. In an embodiment, a measurement 516 (referred to as Space_low or simply S_low) between 504B' line feature and an edge of the nearest line 504A. In some embodiments, a single line 504A interposes a first set of lines 504B and a second set of lines 504B; thus, the S_low 516 and S_top 514 are measured to different edges of the same line 504A. Each of the measurements 512, 514, and 516 may be performed by a scanning electron microscope (SEM) and stored such as stored by a control system.

Using the example of the test pattern 502, the test pattern 502 structure having been formed on the target substrate is measured to determine various aspects of pattern shifting. In an embodiment, a line (polygon) feature 508B' is identified for the measurement. The specific line feature 508B' may be identified by experimental and/or simulation data as providing a suitable sensitivity of its correlation with exposure parameters (e.g., defocus). That is, the line feature 508B' may be determined such that the resulting plots of the measurement of dimensions based on the position of line feature 508B' versus a lithography parameter is essentially flat as discussed in further detail below including with respect to FIGS. 11A, 11B, and/or 11C. In an embodiment, the line feature 508B' is identified as the $n^{th}$ line feature from the offset testing pattern features 508A, where n is an integer greater than 1. In a further embodiment, such as illustrated in FIG. 5B, n equals 5. In another embodiment, n equals 3. In some embodiments, n is a number between 2 and 6.

In an embodiment, a measurement 518 (referred to as SUM) is performed between line features 508B' (e.g., upper and lower). In an embodiment, a measurement 520 (referred to as Space_right or simply S_right) between 508B' line feature and the edge of the nearest line feature 508A. In an embodiment, a measurement 522 (referred to as Space_left or simply S_left) between 508B' line feature and the edge of the nearest 508A feature. In some embodiments, a single line 508A interposes a first set of lines 508B and a second set of lines 508B; thus, the S_right 520 and S_left 522 are measured to different edges of the same line 508A. Each of the measurements 518, 520, and 522 may be performed by a scanning electron microscope (SEM) and stored such as stored by a control system.

FIGS. 5A and 5B are exemplary and other structures may be provided. Other embodiments may be possible including those introducing a first pitch and a second pitch of a pattern and providing suitable measurements thereof. In some embodiments, the suitable measurements are a [1] SUM value, a [2] S_first value, and a [3] S_second value (where S_first and S_second may be left and right or top and bottom as illustrated in FIGS. 5A and 5B). The measurement for the SUM value is equal to value [2] plus value [3] plus 1*wide CD, ide-CD are provided by the test pattern. With reference to FIG. 5B, Value [2] S_first value can be 4*dense pitch+ 1*wide space. The wide space may be provided by the test pattern. Value [3] can be 4*dense pitch+1*wide space. With reference to FIG. 5A, Value [2] S_first value can be 2*dense pitch+1*wide space. The wide space may be provided by the test pattern. Value [3] can be 2*dense pitch+1*wide space.

The method 300 then proceeds to blocks 314 and 316 where the measurement data obtained in block 312 is used to determine one or more parameters of the exposure process. In some embodiments, one of blocks 314 or 316 is omitted. In some embodiments, the determination of the dose of block 314 may be performed but not used to modify a parameter of the lithography system.

In an embodiment, the method 300 proceeds to block 314 where an exposure dose is determined using the measurements obtained in block 312. For example, in an embodiment, an optimized exposure dose (EOP) is determined. It is recognized that the exposure dose changes with pattern density.

Figures 6A, 6B:
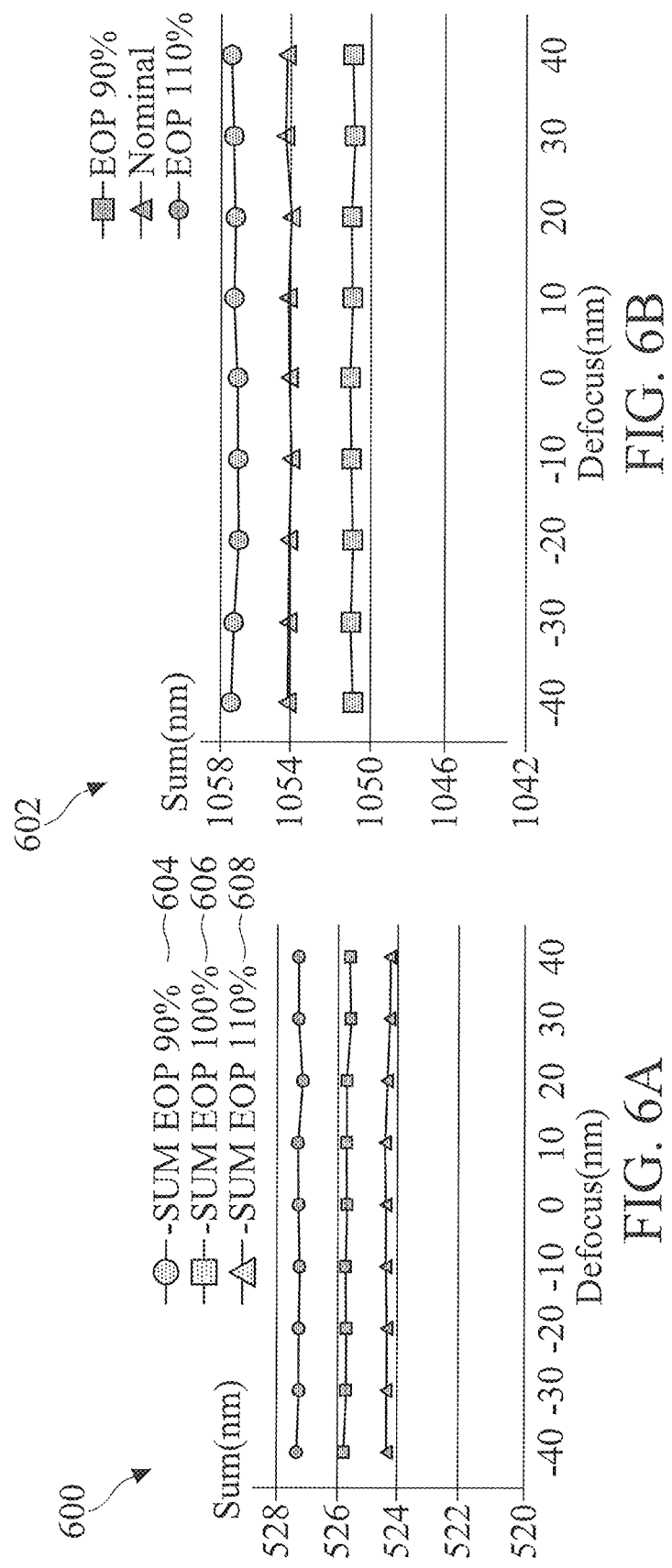

Referring to FIGS. 6A and 6B, illustrated are exemplary graphs 600 and 602. In an embodiment, graph 600 (or plot) is associated with a EUV system, such as the system 100 discussed above with reference to FIG. 1. In an embodiment, graph 602 is associated with a DUV lithography system, such as an immersion lithography system similar to the system 200 discussed above with reference to FIG. 2. The graphs 600 and 602 respectively show a plot of Defocus (nm) to a Sum (nm) measurement. Multiple EOP levels 604, 606, and 608 are plotted for each of graph 600 and 602. The EOP level 606 provides a nominal or baseline dose. The EOP level 604 shows a decreased EOP level, or 90% of the nominal or baseline dose. The EOP level 608 shows an increased EOP level, or 110% of the nominal or baseline dose. In an embodiment, the EOP level 608 of the graph 600 shows a 113% of the nominal or baseline dose. In the illustrated embodiment, three EOP levels are provided however, any number of EOP levels may be provided on the graphs 600 and/or 602.

In some embodiments, the graphs 600 and/or 602 are provided for a given critical dimension (CD) or CD range. The CD associated with the graph 600 and/or 602 may be substantially similar to the CD of the offset testing pattern of the test pattern discussed above. In some embodiments, the CD associated with the graphs 600 and/or 602 are the CD associated with the circuit pattern to be formed using the lithography system.

The graphs 600 and/or 602 may be generated using experimental and/or simulation data from substrates processed by the EUV/DUV systems. Specifically, a significant (e.g., 100s or 1000s) of datapoints relating to dose/defocus and the resultant SUM measurement may be obtained, plotted, and stored for use with the method 300. It is noted from the graphs 600 and 602, that each of the EOP levels 604, 606, 608 is respectively substantially linear; in other words, for a given EOP level, the SUM measurement is substantially constant. As discussed herein, including above with reference to block 304 and below with reference to FIGS. 11A, 11B, and/or 11C, the SUM measurement (e.g., including selection of the $n^{th}$ polygon) may be selected such that this property of linearity is produced.

In an embodiment, the SUM measurement 512 of the test pattern 500 is determined in block 312 of the method 300 and based on this measurement the corresponding EOP level, one of EOP levels 604, 606, or 608 of graph 600 is determined. For example, in an embodiment SUM is determined to be 527 nm and thus, the EOP is determined to correspond to EOP level 604. Thus, the EOP level provided by the lithography system in its current operation is determined to be 90% of nominal.

In an embodiment, the SUM measurement 518 of the test pattern 502 is determined in block 312 of the method 300 and based on this measurement the corresponding EOP level, one of EOP level 604, 606, or 608 of graph 602 is determined. For example, in an embodiment SUM is determined to be 1051 nm and thus, the EOP is determined to correspond to EOP level 604. Thus, the EOP level provided by the lithography system in its current operation is determined to be 90% of nominal.

The method 300 then proceeds to block 316 where a focus parameter (best focus) is determined also using the measurements obtained in block 312 discussed above. The best focus is where the image contrast has a maximum value, the image contrast of a pattern being divided into bright and dark regions between lines/spaces and intermediate regions in the transition.

Referring to FIGS. 7A and 7B, illustrated are exemplary graphs 700 and 702. In an embodiment, graph 700 is associated with an EUV system, such as the system 100 discussed above with reference to FIG. 1. In an embodiment, graph 702 is associated with a DUV lithography system, such as an immersion lithography system similar to the system 200 discussed above with reference to FIG. 2. The graphs 700 and 702 respectively show a plot of Defocus (nm) to a measurement of the test pattern discussed above, namely Delta S, or the difference between S_top 514 and S_bottom 516 with reference to graph 700 and Delta S, or the difference between S_left 522 and S_right 520 with reference to graph 702. Multiple EOP levels 704, 706, and 708 are plotted for each of graph 700 and 702. The EOP level 706 provides a nominal or baseline dose. The EOP level 704 shows a decreased EOP level, or 90% of the nominal or baseline dose. The EOP level 708 shows an increased EOP level, or 110% of the nominal or baseline dose. In the illustrated embodiment, three EOP levels are provided however, any number of EOP levels may be provided on the graphs 700 and/or 702.

In some embodiments, the graphs 700 and/or 702 are provided for a given critical dimension (CD) or CD range. The CD associated with the graph 700 and/or 702 may be substantially similar to the CD of the offset testing pattern of the test pattern discussed above. In some embodiments, the CD associated with the graphs 700 and/or 702 are the CD associated with the circuit pattern to be formed using the lithography system.

The graphs 700 and/or 702 may be generated using experimental and/or simulation data. Specifically, a significant (e.g., 100s or 1000s) of datapoints relating to dose/defocus and the resultant SUM measurement may be obtained, plotted, and stored for use with the method 300. It is noted from the graphs 700 and 702, that each of the EOP levels 604, 606, 608 is respectively substantially linear; in other words, for a given EOP level. As discussed herein, including above with reference to block 304 and below with reference to FIGS. 11A, 11B, and/or 11C, the S_Delta (e.g., including selection of the $n^{th}$ polygon) may be selected such that this property of linearity is produced.

In an embodiment, the S-Delta measurement is determined for the test pattern 500 using the measurements provided in block 312 of the method 300. In an embodiment, S_low 516 is subtracted from S_top 514 providing an S_Delta in nanometers. Based on block 314, the corresponding EOP level, one of EOP level 704, 706, or 708 of graph 700 is recognized. Based on the S_Delta and the selected EOP level (e.g., using graph 600), a point on the plot of the graph 700 is determined, which provides for the corresponding Defocus value (nm) to be determined. For example, in an embodiment S_Delta (for test structure 500) is determined to be 1 nm and the EOP is determined to be 90% of nominal as discussed above in block 314. Thus, Defocus level is determined to be −10 nm offset.

In an embodiment, the S_Delta measurement is determined for the test pattern 502 is determined using the measurements provided in block 312 of the method 300. In an embodiment, S_right 520 is subtracted from S_left 522 providing an S_Delta in nanometers. Based on block 314, the corresponding EOP level, one of EOP level 704, 706, or 708 of graph 700 is recognized. Based on the S_Delta and the selected EOP level, a point on the graph 702 is determined, which provides for the corresponding Defocus value (nm) to be determined. For example, in an embodiment S_Delta (for test structure 602) is determined to be −8 nm and the EOP is determined to be 110% of nominal as discussed above in block 314. Thus, Defocus level is determined to be −10 nm offset.

In some lithography processes, Bossung curves may be used to understand the process parameters; Bossung curves provide for CDs as a function of focus and exposure dose. However, for a given CD measurement of a test structure, a Bossung curve can provide ambiguities as to which EOP/Defocus combination is indicative of the lithography system (i.e., there can be multiple conditions on a Bossung curve each providing a different defocus value). Thus, the present method 300 provides advantages of uniquely determining the best focus. For example, by measuring the summation or differences of identified target polygons as discussed above (see the discussion relating to FIGS. 5A and 5B), the information is not limited to a single space or single CD as with a Bossung curve. Therefore, ambiguities of different processing conditions providing the same CD-output value that can occur with the use of Bossung curves are avoided.

The method 300 then proceeds to block 318 where a parameter of the exposure conditions is modified for an exposure process of a subsequent substrate. It is noted that the method 300 may be performed such that one exposure of the test pattern, described above with reference to block 310, may be performed for a given number of lots. In an embodiment, block 310 (and analysis of the resulting test structure on the substrate) may be performed once per lot. In another embodiment, block 310 (and analysis the test structure on the substrate) may be performed once per several (e.g., 50-100) lots.

In an embodiment, a parameter is modified in the scanner based on the above analysis of blocks 314 and 316 of the method 300. In an embodiment, a focal parameter is modified. The focal modification may be a modification of the position of the scanner with respect to the target substrate. For example, a focus control unit receives the focus measurement result and provides a modification, e.g., drive control of the substrate in the vertical axis. In some embodiments, other parameters are modified with the understanding of the focal condition of the system based on the results of the block 316. For example, the critical dimension target may be modified. It is noted that focal parameters such as best focus may be the same for a given source of the lithography system whether the illumination mode is provided in a symmetrical or asymmetrical manner. In other words, it is independent of the illumination profile and the illumination profile changes between block 308 and block 310. Thus, when switching back to the baseline (e.g., production) illumination mode for exposing the circuit patterns, the exposure can be stopped at the appropriate CD due to the now-quantified defocus condition. For example, in an embodiment, the exposure can stop at a CD=49 nm rather than a baseline of 50 nm due to a defocus condition determined which modifies the nominal CD readout value. In an embodiment, the dose of the exposure (EOP) may be manipulated for exposure of the circuit parameters.

The method 300 of FIG. 3 may then continue to block 320 where a circuit pattern is exposed on a target substrate using the modified parameters determined in block 318. It is noted that in some embodiments, the parameters of the exposure tool may not be modified but results obtained from blocks 314 and/or 316 may confirm current setting(s) of the tool and the exposure may continue as is.

The circuit patterns may correspond to patterns of metal, oxide, or semiconductor layers that make up the various components of the IC device to be fabricated. The various layers combine to form various IC features. For example, a portion of the circuit patterns may include various IC features, such as active regions, gate electrodes, source and drain regions, metal lines, contact holes, contact plugs, via holes, via plugs, and openings for bonding pads, to be formed in a semiconductor substrate (such as a silicon wafer) and various material layers disposed on the semiconductor substrate.

The substrate, for the exposure of the test pattern as well as the circuit pattern may be a semiconductor wafer. The semiconductor wafer includes a silicon substrate or other proper substrate having material layers formed thereon. Other proper substrate materials include another suitable elementary semiconductor, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. The semiconductor wafer may further include various doped regions, dielectric features, and multilevel interconnects (formed at subsequent manufacturing steps). The circuit pattern may be used in a variety of processes. For example, the circuit pattern may be used in an ion implantation process to form various doped regions in the semiconductor wafer, in an etching process to form various etching regions in the semiconductor wafer, and/or other suitable processes.

The method 300 in some embodiments may continue to perform other semiconductor device fabrication processes to form circuit devices associated with the circuit pattern exposed onto the substrate as illustrated in block 322. The circuit pattern may be associated with various integrated circuit devices, such as metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), including FinFETs), diodes, or other suitable elements.

Figure 4:
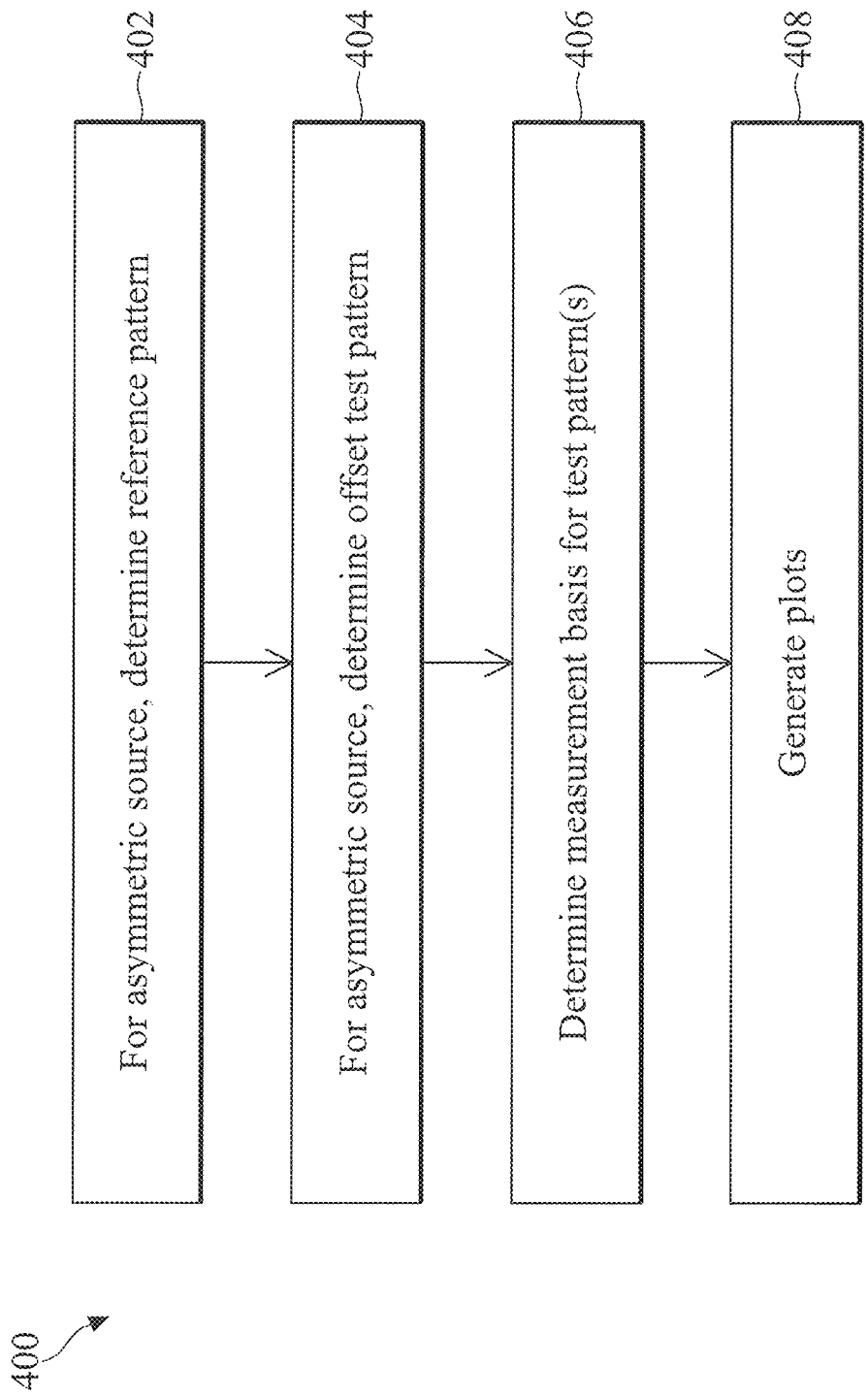
FIG. 4 is a flow diagram of a method of preparing a test pattern according to various embodiments of the present disclosure.

Referring now to FIG. 4, illustrated is additional details which may be applied to block 304 of the method 300, which includes developing a test pattern for monitoring a lithography exposure system. It is noted that as discussed above, the development of the test pattern refers to not only the line/space pattern, line/space pitch, and line/space widths, but also the measurements that will be taken on said pattern when formed as a test pattern structure on a substrate, such as discussed with reference to block 312 of the method 300.

In an embodiment, the method 400 may begin with block 402 where a reference pattern is determined and concurrently therewith block 404 where an offset testing pattern is determined. Each of the reference pattern and the offset pattern may be used in conjunction to form a test pattern such as the exemplary test patterns of FIGS. 5A and 5B, discussed above. The offset testing pattern and the reference pattern are substantially similar to as discussed above.

Figure 10:
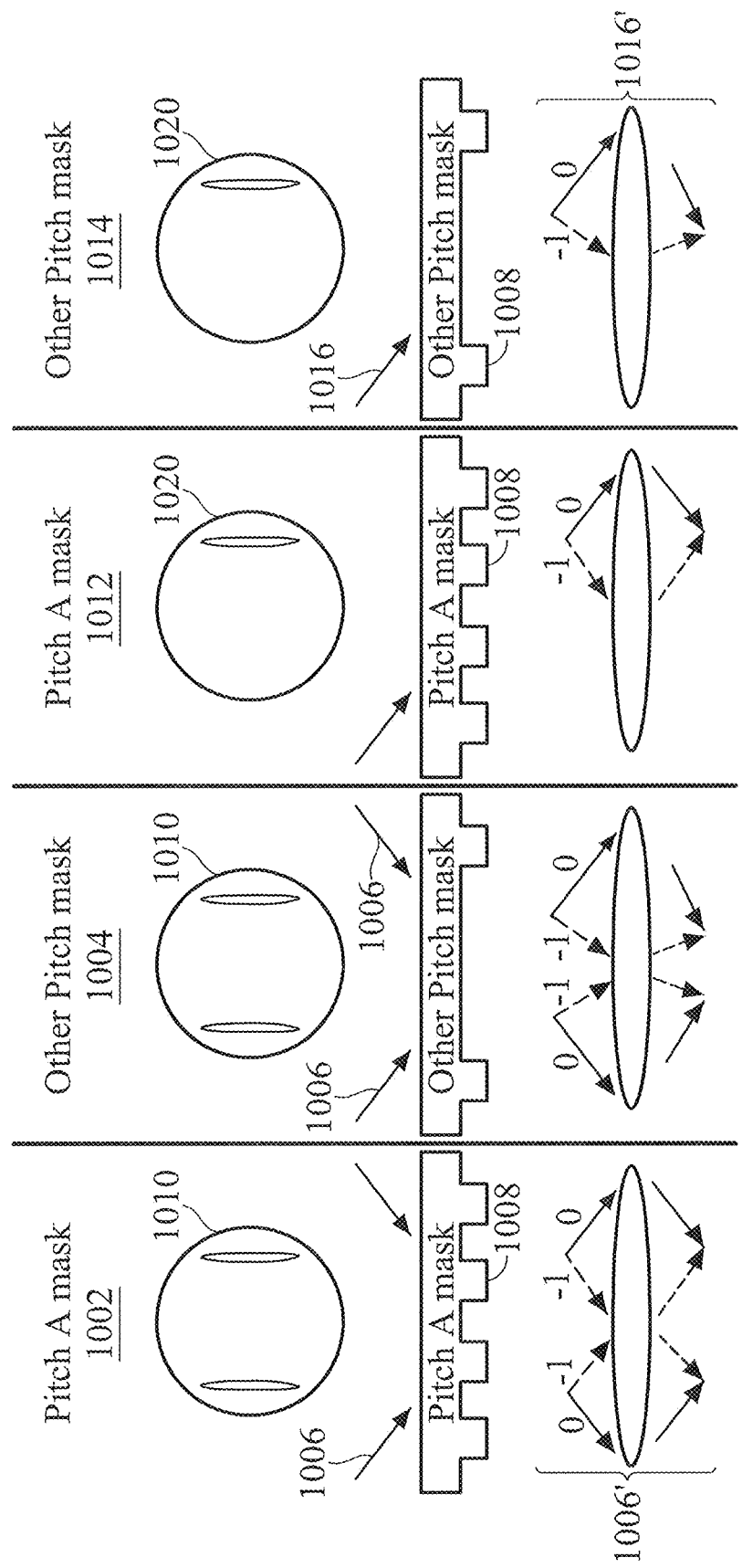
FIGS. 10 and 12 are block diagrams of various aspects of exposure of a test pattern according to various embodiments of the present disclosure.

Referring to FIG. 10, illustrated is an exemplary comparison of illumination modes and test pattern pitches that is illustrative of the determination of the reference pattern and the offset testing pattern selection. Blocks (or columns) 1002 and 1004 illustrate an illumination profile 1010, which may be used to fabricate a circuit pattern onto a target substrate. The illumination profile 1010 of blocks 1002 and 1004 provide a symmetrical profile. It is noted that the illumination profile 1010 may be optimized for the circuit pattern to be formed. The radiation 1006 defined by the illumination profile 1010 is incident an exemplary mask 1008. The mask 1008 may be a reflective or transmissive mask, substantially similar to masks 106 and/or 218, discussed above. The radiation after patterning by the mask 1008 is illustrated as transmitted illumination 1006'. With respect to blocks 1002 and 1004, the transmitted illumination has multiple exemplary diffraction orders illustrated—a first order and $0^{th}$ order. It is typical that under a condition of defocus certain orders of radiation may be dismissed thus causing pattern position to be shifted. It is noted that the transmitted illumination 1006' is illustrated before and after an exemplary lens; however, this is for illustration only and there may be many lens or mirrors directing the illumination 1006' to the substrate.

In contrast, blocks 1012 and 1014 illustrate an illumination profile 1020, which may be used to fabricate a test pattern onto a target substrate according to aspects of the present disclosure. The illumination profile 1020 of blocks 1012 and 1014 provide an asymmetrical, monopole profile. The radiation 1016 defined by the illumination profile 1020 is illustrated as being incident an exemplary mask 1008. Again, the mask 1008 may be a reflective or transmissive mask, substantially similar to masks 106 and/or 218, discussed above. The radiation after patterning by the mask 1008 is illustrated as transmitted illumination 1016'. The transmitted illumination 1016' is illustrated as having multiple exemplary diffraction orders—a first order and $0^{th}$ order being illustrated. For block 1014, the radiation after patterning by the mask 1008 is illustrated as transmitted illumination 1016' having first order and $0^{th}$ order illustrated and being asymmetrical. It is typical that under a condition of defocus certain orders of radiation diffracted (in the case of EUV lithography) may be dismissed thus causing pattern position to be shifted. In contrast, it is noted that the $0^{th}$ and $1^{st}$ order for block 1012 are symmetric. This is on account of the line features width/pitch of the mask 1008 of block 1012 allows for no shift of the imaged pattern. Thus, the pattern provided in block 1012 is illustrative of a reference pattern.

Thus, FIG. 10 is illustrative of manners to determine the reference pattern (width/pitch) for a given illumination profile. That is, it is desired to determine a polygon width/pitch that provides for symmetric reflection from the mask, as illustrated by block 1012. This allows for a given amount of defocus, the reproduced pattern to be substantially unshifted. Conversely, it is desired to determine a pitch that provides for asymmetric reflection from the mask, as illustrated in block 1014 for the offset test pattern. This allows for a given amount of defocus, the reproduced pattern to be shifted by an amount. The amount of shift can be correlated with the amount of defocus, as discussed above. The offset test pattern (e.g., provided in block 1012) may be substantially similar to the dimensions of the circuit pattern to be formed.

Figure 11A:
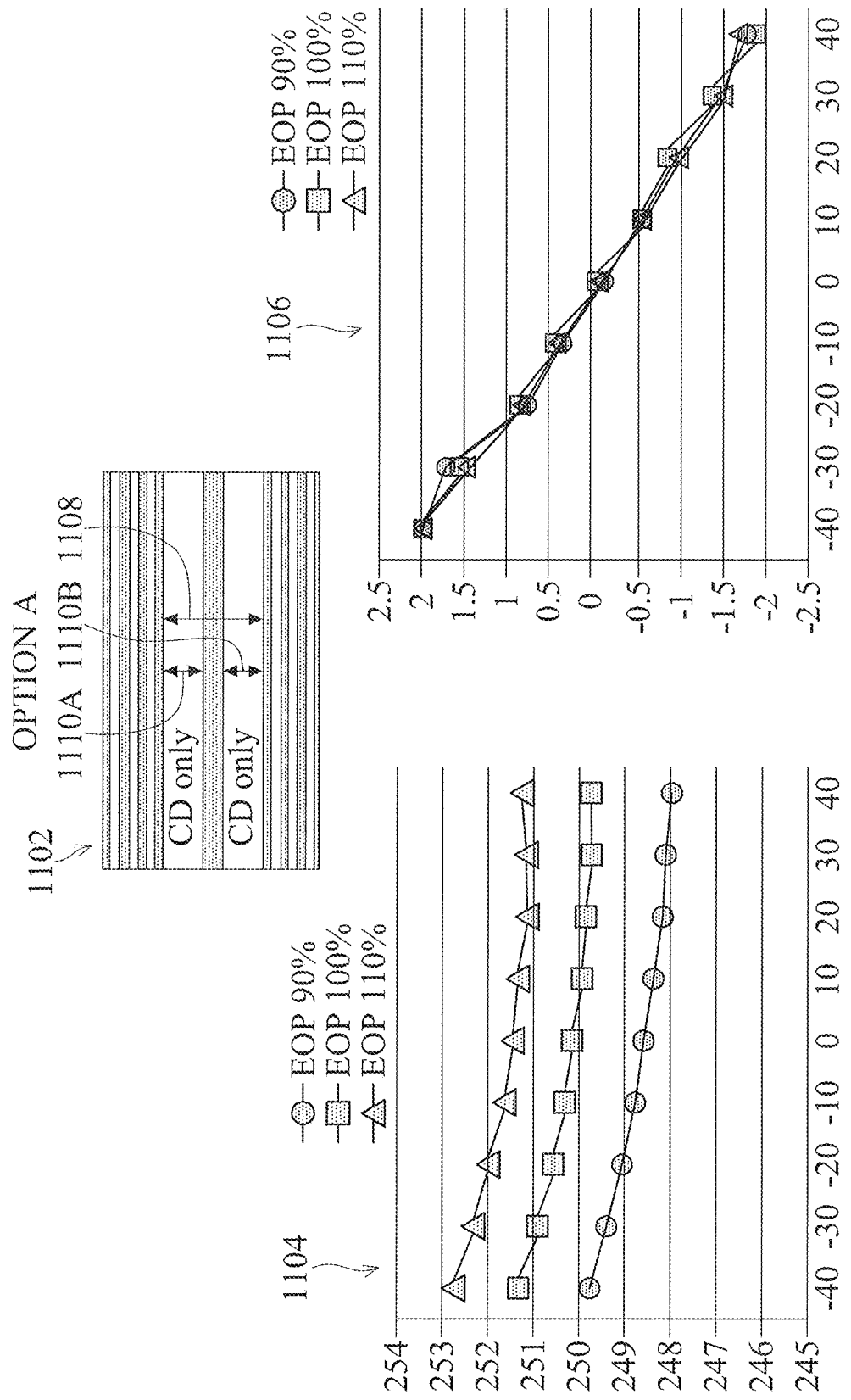
FIGS. 11A, 11B, and 11C each illustrate measurements obtained from exemplary test patterns according to various embodiments of the present disclosure.
Figure 11B:
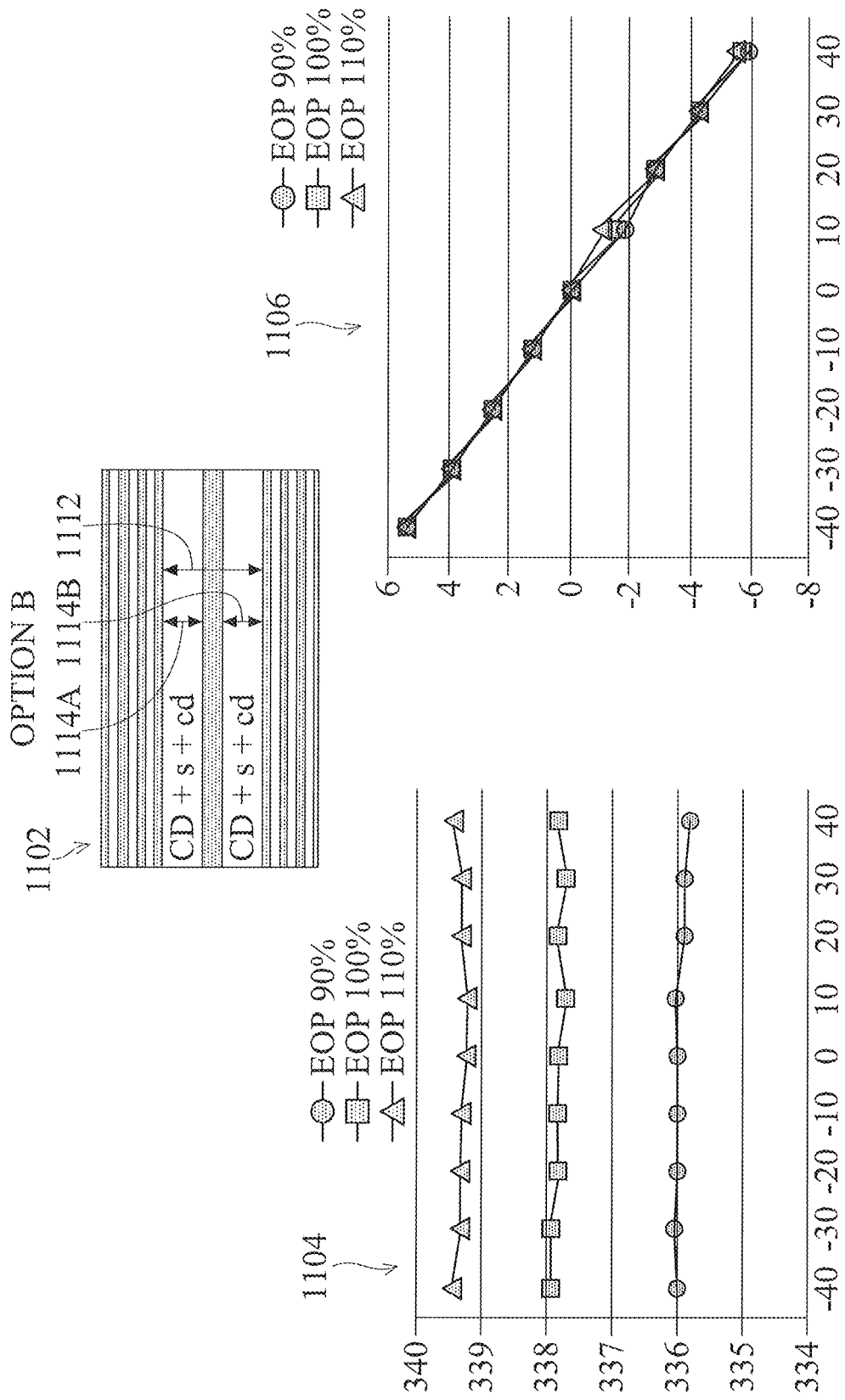
Figure 11C:
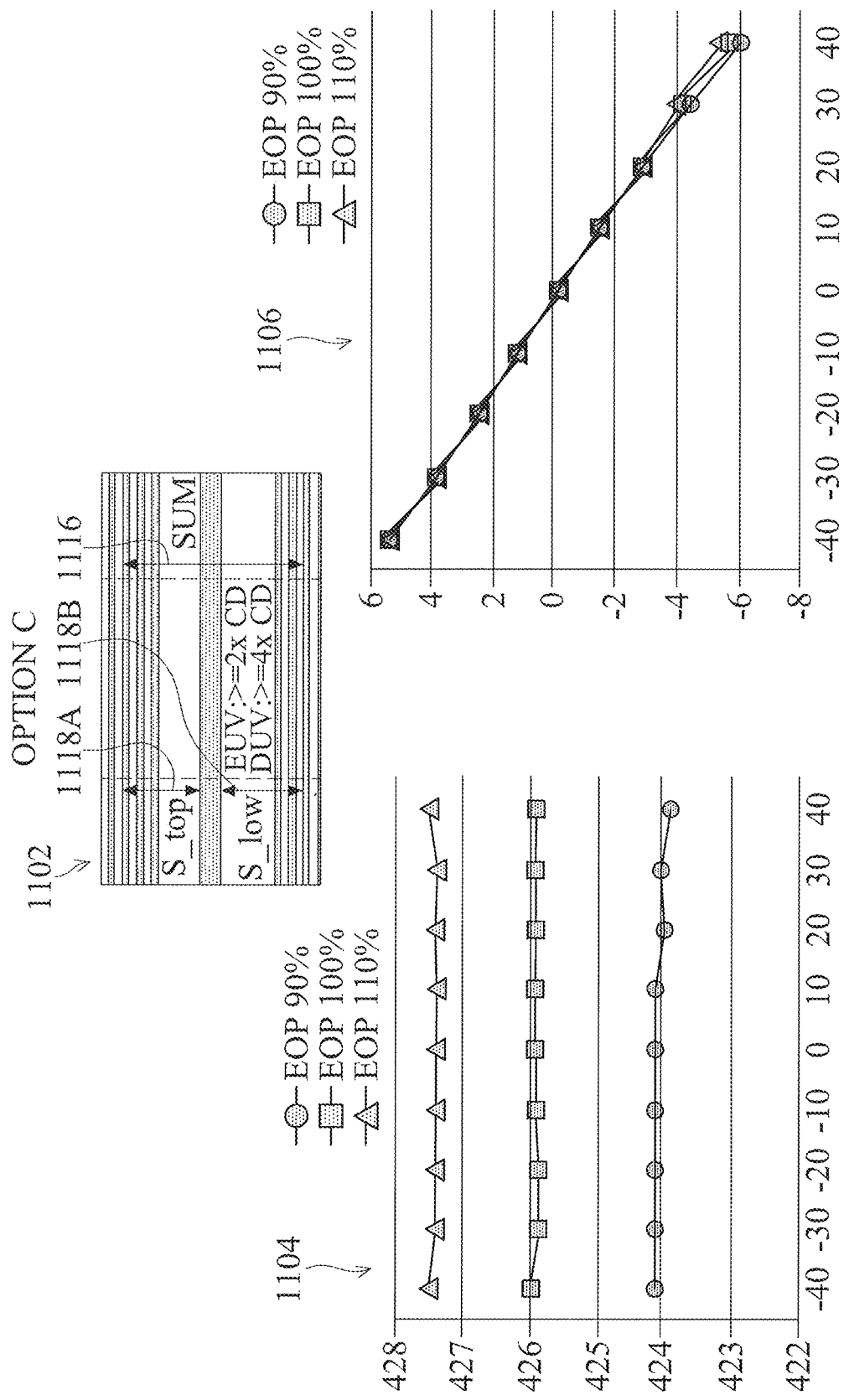

The method 400 may then proceed to block 406 where a plurality of measurements to be taken on the test pattern is determined. The plurality of measurements may be substantially similar to the measurements discussed above with reference to block 312. FIGS. 11A, 11B, and 11c are illustrative of three respective exemplary options for measurements to be obtained from a test pattern 1102. The test pattern 1102 may be determined by block 402 and 404 discussed above and/or be substantially similar to the test patterns discussed above including with reference to block 304 and FIGS. 5A and 5B. The test pattern 1102 is illustrated as formed as test pattern structure on a target substrate and suitable for capturing dimensions thereof by a measurement device, such as SEM.

Illustrated in Option A is provided a measurement of dimension 1108 and dimensions 1110. Dimensions 1108 and/or 1110A/B may be measured using an SEM. Illustrated in Option B is provided a measurement of dimension 1112 and dimensions 1114A/B. Dimensions 1112 and/or 1114A/B may be measured using an SEM. As illustrated Option B measurements include the adjacent space, terminating at the next adjacent line/polygon, as compared to Option A. Illustrated in Option C is provided a measurement of dimension 1116 and dimensions 1118A/B. Dimensions 1116 and/or 1118A/B may be measured using an SEM. It is noted that dimensions 1116 and 1118A/B are measured such that they include a plurality of polygon/lines such as discussed above with reference to block 312, for example, measuring up to the $n^{th}$ polygon/line.

Block 408 generates plots. For each of Option A, Option B, and Option C illustrated are a plurality of graphs respectively. The graphs 1104 each illustrate the associated dimension 1108, 1112, or 1116 (nm) respectively plotted against the defocus (nm) for a plurality of doses (% of nominal). The graphs 1106 each illustrate the associated: a difference in measurements 1110A and 1110B, a difference in 1114A and 1114B, or a difference in 1118A and 1118B respectively plotted against the defocus (nm) for a plurality of doses (% of nominal).

The graph 1104 for Option A illustrates a difference in dimension 1108 for a given dose of between about 1.5 and about 1.8 nanometers. In contrast, the graph 1104 for Option B illustrates a difference in the dimension 1112 of 0.2 nanometers. Still further, the graph 1104 for Option C illustrates a difference in the measurement of 1116 of 0.1 nanometers. The graph 1104 for Option C produces the most linear response. Thus, Option B provides an improved (over that of Option A) accuracy for use to correlate the measurement (1112) to the dose/focus as discussed above with reference to block 314. Similarly, Option C provides an improved (over that of Options A and B) accuracy for use to correlate the measurement (1116) to the dose/focus as discussed above with reference to block 314. Similarly, the respective graphs 1106 provide for a greater correlation coefficient (R) in Option C than Option B, which provides for an improvement over Option A. Thus, FIGS. 11A, 11B, and 11C are illustrative of the importance of determining the measurement criteria for the test pattern selected.

Turning to FIG. 12, illustrated is a block diagram supporting the explanation of the use of an asymmetric source for exposing the test pattern such as described above with reference to block 404 of FIG. 4 in comparison with a baseline (symmetrical illumination). In comparison to the asymmetric source, a dipole illumination mode is illustrated as being incident a mask, which provides a patterned light as illustrated by the $1^{st}$ and 0 order transmissions. As illustrated the left of FIG. 12, these are symmetrical and thus, in their combination no offset is seen despite a change in focus. In contrast, for the right portion of FIG. 12 and the provision of an asymmetric source, the pattern shift is quantified from the offset because there is no interference between symmetric, patterned light. Thus, certain embodiments of the methods presented rely on the asymmetric source providing a surprising benefit over that of the symmetric source.

Figure 9:
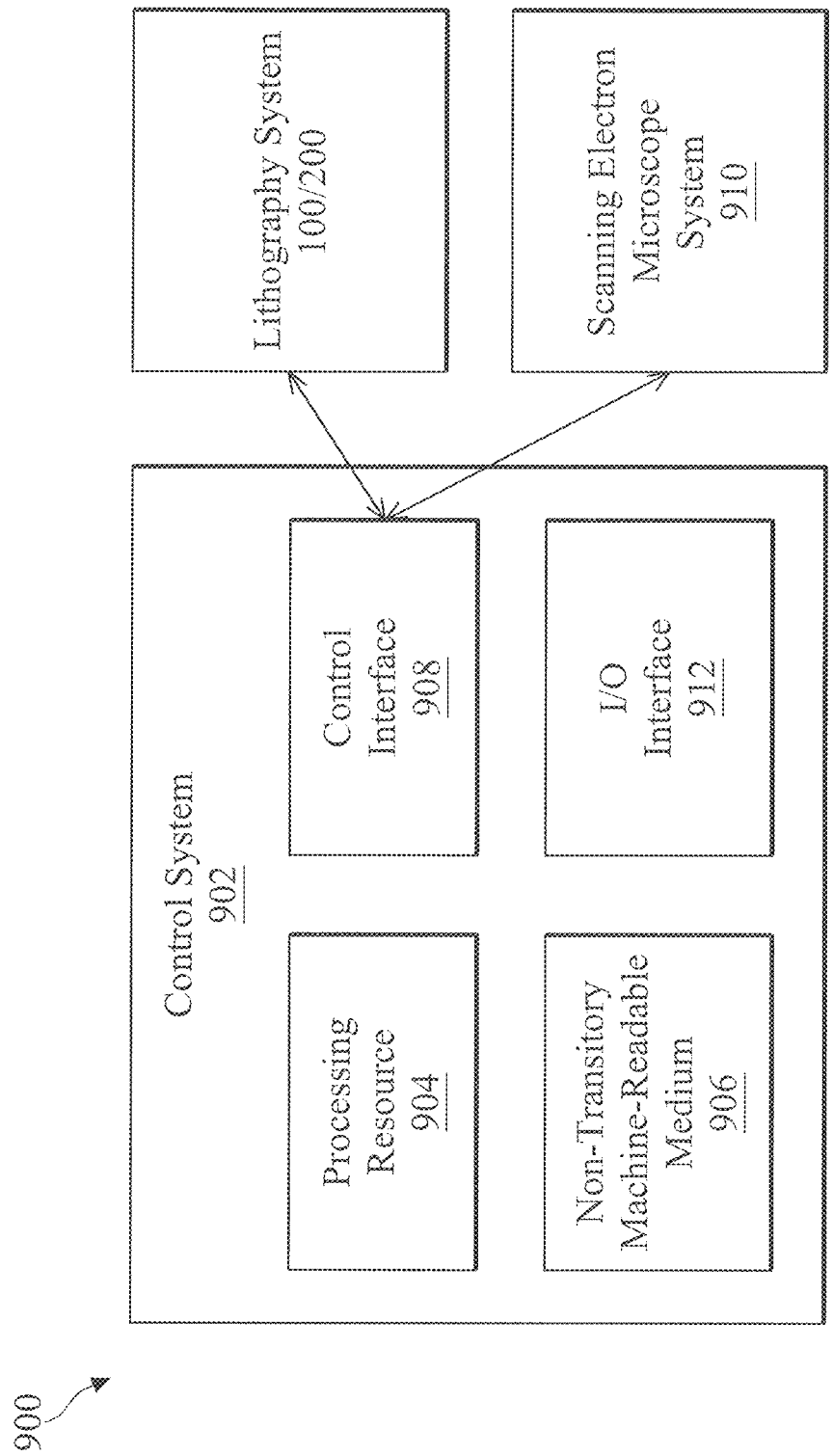
FIG. 9 is a block diagram of a lithographic environment according to various embodiments of the present disclosure.

In various embodiments, the technique is performed by using combinations of dedicated, fixed-function computing elements and programmable computing elements executing software instructions. Accordingly, it is understood that any of the steps of method 300 may be implemented by a computing system using corresponding instructions stored on or in a non-transitory machine-readable medium accessible by the processing system. Examples of such a system and non-transitory machine-readable medium are described with reference to FIG. 9. In that regard, FIG. 9 is a block diagram of a lithographic environment 900 according to various embodiments of the present disclosure.

The lithographic environment 900 includes a control system 902. The control system 902 includes a processing resource 904 that may include any number and type of processing elements such as Central Processing Units (CPUs) Graphical Processing Units (GPUs), Application-Specific Integrated Circuits (ASICs), microcontrollers, and/or other suitable processing elements. The processing resource 904 is coupled to a tangible non-transitory machine-readable medium 906 to execute instructions stored on the medium 906. For the purposes of this description, the tangible non-transitory machine-readable medium 906 may be any apparatus that can store the program for use by or in connection with the instruction execution system, apparatus, or device. The medium 906 may include non-volatile memory including magnetic storage, solid-state storage, optical storage, cache memory, and/or battery-backed Random Access Memory (RAM). In various examples, the medium 906 stores instructions that cause the processing resource 904 to perform the processes of method 300 of determining parameters of a lithography system 914, which may be substantially similar to the systems 100 and/or 200, described above with reference to FIGS. 1 and 2. In some embodiments, the medium 906 stores instructions that cause the processing resource 904 to perform the method 1000 described below with reference to FIG. 10, which includes determining a test pattern layout suitable for use in determining parameters of a lithography system.

For that purpose, the control system 902 may include a fabrication interface 908 that sends and receives signals to a lithography system such as the system 100 or the system 200 discussed above. The control system 902 may also include an I/O interface 912 for communicating test information and results with a user and/or other computing systems. Accordingly, the I/O interface 912 may include controllers for video output (e.g., a GPU), user input (e.g., controllers for a keyboard, a mouse, a pen input device, a touchpad, etc.), network controllers (e.g., Ethernet and/or wireless communication controllers), and/or other suitable I/O controllers. The control system 902 may be substantially similar to the control systems 118 and 202 of FIGS. 1 and 2 respectively.

Figure 13:
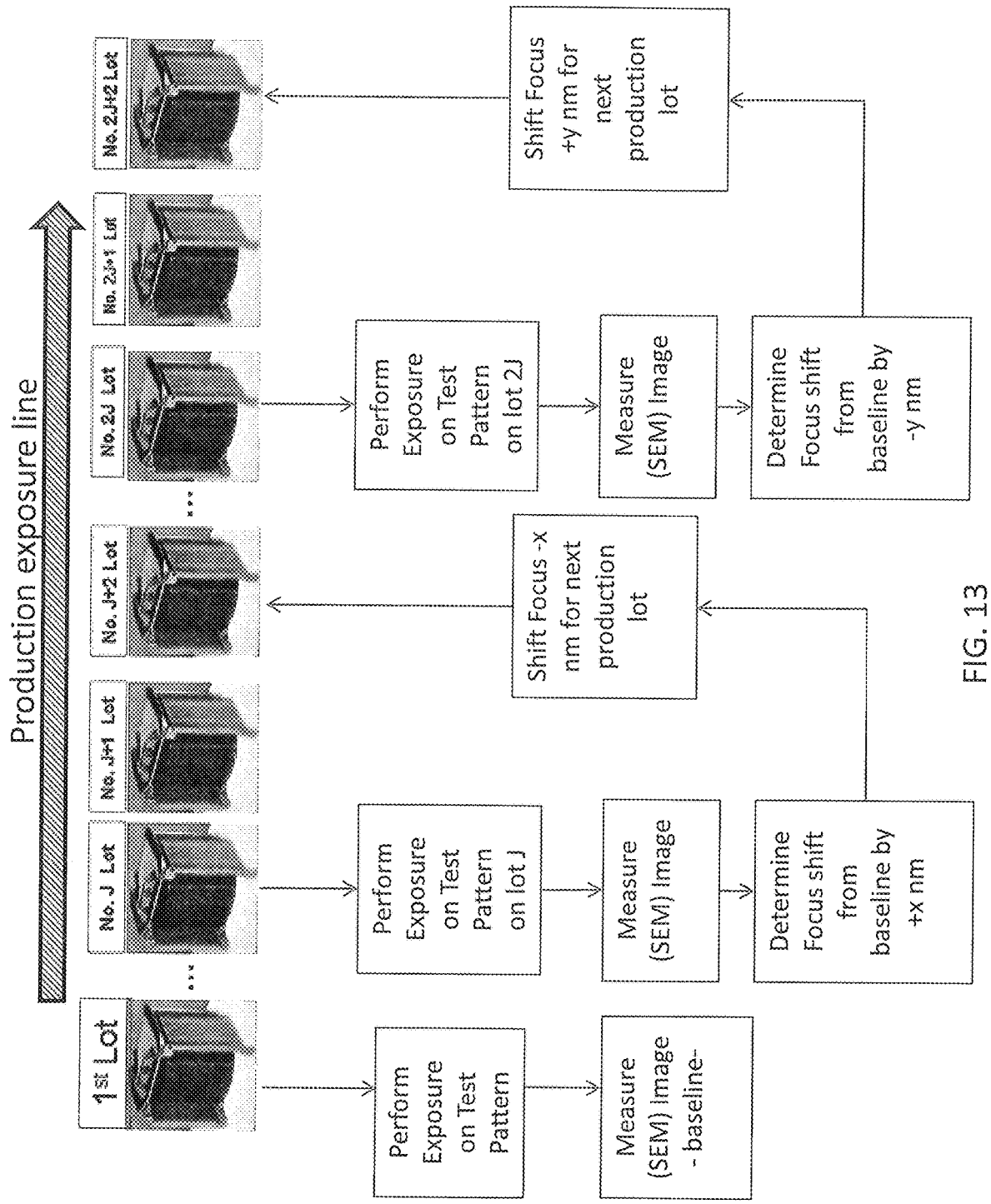
FIG. 13 illustrates a block diagram of a production line implementing the method of FIG. 3.

FIG. 13 is illustrative of implementing the method of FIG. 3 in a production line. As illustrated, the sampling of the test pattern is provided every "J" lots, however, any interval is possible. The $1^{st}$ Lot includes circuit pattern which is exposed as illustrated in block 308 of the method 300. For the $1^{st}$ Lot, a baseline exposure and measurement of the test pattern is then provided. This is as illustrated in blocks 310 and 312 of the method 300 of FIG. 3. In an embodiment, the baseline exposure provides for a given parameter or set of parameters (e.g., dose, focus). At Lot J, before or after performing irradiation of the circuit pattern of Lot J (block 308), another exposure of the test structure is performed as illustrated in block 310. An image from this exposure is measured as illustrated in block 312, and a difference determined from the baseline image of Lot 1. In an embodiment, a focus is determined to be offset by a given value. This information is then used to adjust the production exposure conditions as indicated in block 318 of the method 300. In the illustrated embodiment, the adjustment is performed for the J+2 Lot however "2" may be any number depending on the throughput of the production exposure line. This adjustment allows the J+2 Lot to be matched to the Lot 1 in terms of resultant focus.

At Lot 2J, before or after performing irradiation of the circuit pattern of Lot J (block 308), another exposure of the test structure is performed as illustrated in block 310. An image from this exposure is measured as illustrated in block 312, and a difference determined from the baseline image of Lot 1. In an embodiment, a focus is determined to be offset by a given value. This information is then used to adjust the production exposure conditions as indicated in block 318 of the method 300. In the illustrated embodiment, the adjustment is performed for the 2J+2 Lot however "2" may be any number depending on the throughput of the production exposure line. This adjustment allows the 2J+2 Lot to be matched to the Lot 1 in terms of resultant focus. This may continue throughout the production.

Thus, provided in some embodiments are systems and methods for monitoring and/or controlling lithography tools such as those used for EUV or immersion lithography exposure. By determining test structures and/or measurement criteria thereof, a suitable correlation between the offset of a test structure and a defocus amount can be obtained. This can be used to monitor and/or control the exposure of circuit patterns in a lower cost and less time intensive manner. This technique applies one extra exposure (with $2^{nd}$ illumination, the asymmetric illumination) on the wafer somewhere without a circuit patterns. Then the exposed features are measured by SEM. The focus information is then extracted from the SEM image. Thus, the present disclosure provides examples of methods including a method of performing a lithography process for a semiconductor device. The method may include providing a test pattern having a plurality of lines, the plurality of lines arranged at a first pitch and a second pitch. The test pattern is exposed to form a test structure having the test pattern on a semiconductor substrate. The test structure is measured including determining a distance between a first line of the plurality of lines and a second line of the plurality of lines, wherein at least a third line of the plurality of lines interposes the first line and the second line and correlating the distance to an offset of a lithography parameter. The lithography parameter is then adjusted before exposing a circuit pattern on another semiconductor substrate.

Another method of performing a lithography process includes providing a test pattern. The test pattern includes a first set of lines arranged at a first pitch, a second set of lines arranged at the first pitch, and further includes at least one reference line between the first set of lines and the second set of lines. The test pattern is exposed with a radiation source providing an asymmetric, monopole illumination profile to form a test pattern structure on a substrate. The method includes measuring the test pattern structure. The measuring includes determining a distance between a first line of the first set of lines and a second line of the second set of lines; and correlating the distance to an offset of a lithography parameter. A lithography process is adjusted based on the offset of the lithography parameter. The adjusted lithography process is then performed to expose a circuit pattern onto another substrate.

Another embodiment of a method includes performing an exposure process on a first plurality of semiconductor substrates using a first illumination mode of a lithography system. A monitoring exposure process is performed on another semiconductor substrate using a second illumination mode of the lithography system. The monitoring exposure process includes irradiating a first region of a test pattern providing for a symmetrical diffraction and irradiating a second region of the test pattern providing for an asymmetrical diffraction. The test pattern exposed on the another semiconductor substrate is measured to determine a shift of features of the second region of the test pattern. The determined shift is used to determine a defocus amount of the lithography system.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of semiconductor device manufacturing, comprising:
   exposing a circuit pattern on a first substrate of a first lot using a first illumination mode;
   exposing a test pattern on the first substrate of the first lot using a second illumination mode;
   measuring an image of the test pattern on the first substrate;
   exposing the test pattern on a second substrate of a second lot;
   measuring the test pattern on the second substrate; and using a comparison of the measured test pattern on first substrate and the measured test pattern on the second substrate to determine a shift of a lithography parameter for a third substrate.

2. The method of claim 1, further comprising:
using the determined shift of the lithography parameter to determine a parameter in exposing a third substrate using the first illumination mode.

3. The method of claim 1, wherein the lithography parameter is focus.

4. The method of claim 1, wherein the first illumination mode and the second illumination mode differ by pole number, pole location or pole size.

5. The method of claim 1, wherein the measuring the test pattern on the second substrate is performed using an image.

6. The method of claim 1, wherein the measuring the test pattern on the second substrate is performed by a scanning electron microscope (SEM).

7. The method of claim 1, wherein the exposing includes using an extreme ultraviolet (EUV) radiation.

8. A method of semiconductor device manufacturing, comprising:
creating a baseline image for a first substrate, wherein the creating the baseline image includes:
providing a test pattern and a circuit pattern on the first substrate;
exposing the circuit pattern using a first illumination mode; and
exposing the test pattern using a second illumination mode;
measuring an image of the test pattern to provide the baseline image; and
using the baseline image to determine a focus parameter for the first illumination mode;
exposing the test pattern on a second substrate using the second illumination mode;
comparing of the baseline image and the test pattern on the second substrate; and
using the comparison to determine a focus parameter for an exposure of the circuit pattern on a third substrate using the first illumination mode.

9. The method of claim 8, wherein the exposing the test pattern in an extreme ultraviolet (EUV) radiation lithography process having the first illumination mode.

10. The method of claim 8, wherein the second illumination mode is an asymmetric source of radiation.

11. The method of claim 10, wherein the first illumination mode is a symmetric source of radiation.

12. The method of claim 11, wherein the second illumination mode is asymmetrical, monopole illumination.

13. The method of claim 8, wherein the first illumination mode and the second illumination mode differ in at least one of a size of a pole, a location of a pole, or a number of poles.

14. The method of claim 8, wherein the measuring an image of the test pattern includes measuring a distance between features of the test pattern.

15. A method of controlling a lithography process for a semiconductor device, the method comprising:
exposing a test pattern to form a test structure over a first semiconductor substrate using a first illumination mode;
measuring the test structure to provide a baseline image;
exposing circuit patterns of a plurality of semiconductor substrates using a second illumination mode;
after exposing the circuit patterns, exposing the test pattern on a second semiconductor substrate using the first illumination mode;
measuring the test pattern on the second semiconductor substrate;
adjusting a lithography parameter based on a comparison of the baseline image and the measured test pattern of the second semiconductor substrate; and
using the adjusted lithography parameter to expose a circuit pattern on a third semiconductor substrate using the first illumination mode.

16. The method of claim 15, wherein the adjusted lithography parameter is one of focus or dose.

17. The method of claim 15, wherein the measuring the test structure includes using a scanning electron microscope.

18. The method of claim 15, wherein the measuring the test pattern includes measuring a distance on an image of the test pattern on the second semiconductor substrate.

19. The method of claim 15, wherein one of the first illumination mode or the second illumination mode is an asymmetrical illumination and the other of the first illumination mode and the second illumination mode is symmetrical illumination.

20. The method of claim 15, wherein one of the first illumination mode or the second illumination mode is an asymmetrical, monopole illumination and the other of the first illumination mode and the second illumination mode is symmetrical, multi-pole illumination.

* * * * *